(12) United States Patent
Bouisse et al.

(10) Patent No.: US 11,990,871 B2
(45) Date of Patent: *May 21, 2024

(54) INVERTED DOHERTY POWER AMPLIFIER WITH LARGE RF FRACTIONAL AND INSTANTANEOUS BANDWIDTHS

(71) Applicant: MACOM Technology Solutions Holdings, Inc., Lowell, MA (US)

(72) Inventors: Gerard Bouisse, Toulouse (FR); Christian Cassou, Tournefeuille (FR)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 215 days.

This patent is subject to a terminal disclaimer.

(21) Appl. No.: 17/503,939

(22) Filed: Oct. 18, 2021

(65) Prior Publication Data
US 2022/0038058 A1    Feb. 3, 2022

Related U.S. Application Data

(63) Continuation of application No. 16/607,083, filed as application No. PCT/IB2017/000604 on Apr. 24, 2017, now Pat. No. 11,159,125.

(51) Int. Cl.
H03F 1/02 (2006.01)
H03F 1/56 (2006.01)
H03F 3/21 (2006.01)

(52) U.S. Cl.
CPC .......... H03F 1/0288 (2013.01); H03F 1/565 (2013.01); H03F 3/211 (2013.01);
(Continued)

(58) Field of Classification Search
CPC ........ H03F 1/0288; H03F 1/565; H03F 3/211; H03F 2200/222; H03F 2200/387; H03F 2200/451
(Continued)

(56) References Cited

U.S. PATENT DOCUMENTS

| | | |
|---|---|---|
| 4,375,054 A | 2/1983 | Pavio |
| 6,085,074 A | 7/2000 | Cygan |

(Continued)

FOREIGN PATENT DOCUMENTS

| | | |
|---|---|---|
| CN | 101494439 A | 7/2009 |
| CN | 102137518 A | 7/2011 |

(Continued)

OTHER PUBLICATIONS

Ceylan et al., "Refine Biasing Networks for High PA Low Frequency Stability", Microwave & RF, Apr. 17, 2018, pp. 1-6 (Year: 2018).*

(Continued)

Primary Examiner — Hafizur Rahman
(74) Attorney, Agent, or Firm — Perilla Knox & Hildebrandt LLP; Jason M. Perilla

(57) ABSTRACT

Apparatus and methods for an inverted Doherty amplifier operating at gigahertz frequencies are described. RF fractional bandwidth and signal bandwidth may be increased over a conventional Doherty amplifier configuration when impedance-matching components and an impedance inverter in an output network of the inverted Doherty amplifier are designed based on characteristics of the main and peaking amplifier and asymmetry factor of the amplifier.

20 Claims, 6 Drawing Sheets

(52) U.S. Cl.
CPC .. *H03F 2200/222* (2013.01); *H03F 2200/387* (2013.01); *H03F 2200/451* (2013.01)

(58) Field of Classification Search
USPC ........................................................ 330/295
See application file for complete search history.

(56) References Cited

U.S. PATENT DOCUMENTS

| | | | |
|---|---|---|---|
| 6,262,629 | B1 | 7/2001 | Stengel et al. |
| 6,649,287 | B2 | 11/2003 | Weeks, Jr. et al. |
| 6,791,417 | B2 | 9/2004 | Pengelly et al. |
| 7,078,976 | B2 | 7/2006 | Blednov |
| 7,109,790 | B2 | 9/2006 | Kwon et al. |
| 7,218,175 | B1 | 5/2007 | Kobayashi |
| 7,414,478 | B2 | 8/2008 | Elmala et al. |
| 7,541,866 | B2 | 6/2009 | Bowles et al. |
| 7,602,241 | B2 | 10/2009 | Suzuki et al. |
| 7,663,434 | B2 | 2/2010 | Yang et al. |
| 7,876,159 | B2 | 1/2011 | Wang et al. |
| 7,973,600 | B2 | 7/2011 | Yu |
| 8,237,498 | B2 | 8/2012 | Kato et al. |
| 8,358,174 | B2 | 1/2013 | Kim et al. |
| 8,395,450 | B2 | 3/2013 | Deguchi et al. |
| 8,466,746 | B2 | 6/2013 | Jeong et al. |
| 8,487,703 | B2 | 7/2013 | Blednov |
| 9,071,211 | B1 | 6/2015 | Ozard |
| 9,083,284 | B2 | 7/2015 | Maslennikov et al. |
| 9,331,638 | B2 | 5/2016 | Chen et al. |
| 9,531,329 | B2 | 12/2016 | Tanimoto |
| 9,543,914 | B2 | 1/2017 | Bouny |
| 9,621,115 | B1 | 4/2017 | Wu |
| 9,667,199 | B1 | 5/2017 | Mclaren |
| 9,673,766 | B1 | 6/2017 | Roberts et al. |
| 9,774,301 | B1 | 9/2017 | Maalouf et al. |
| 9,813,036 | B2 | 11/2017 | Folkmann et al. |
| 9,966,903 | B1* | 5/2018 | McLaren ................. H03F 3/211 |
| 10,211,785 | B2 | 2/2019 | McLaren |
| 10,284,146 | B2 | 5/2019 | Wu et al. |
| 10,284,147 | B2 | 5/2019 | Wu et al. |
| 10,305,437 | B2 | 5/2019 | Ozard et al. |
| 11,018,629 | B2 | 5/2021 | Min et al. |
| 11,050,389 | B2 | 6/2021 | Cassou et al. |
| 11,159,125 | B2 | 10/2021 | Bouisse et al. |
| 11,190,143 | B2 | 11/2021 | Pham et al. |
| 11,233,483 | B2 | 1/2022 | Bouisse et al. |
| 11,245,363 | B2 | 2/2022 | Bouisse |
| 11,283,410 | B2 | 3/2022 | Bouisse |
| 11,496,098 | B2 | 11/2022 | Wang |
| 11,515,842 | B2 | 11/2022 | Wang et al. |
| 11,522,499 | B2 | 12/2022 | Hue et al. |
| 2003/0137346 | A1 | 7/2003 | Hellberg |
| 2003/0141933 | A1 | 7/2003 | Pengelly |
| 2005/0206462 | A1 | 9/2005 | McCorquodale et al. |
| 2006/0097783 | A1 | 5/2006 | Okubo et al. |
| 2006/0145757 | A1 | 7/2006 | Kim et al. |
| 2007/0205827 | A1 | 9/2007 | Mobbs |
| 2010/0315162 | A1 | 12/2010 | Gajadharsing et al. |
| 2011/0140775 | A1 | 6/2011 | Hong et al. |
| 2011/0193624 | A1 | 8/2011 | Scott et al. |
| 2011/0204980 | A1 | 8/2011 | Blednov |
| 2012/0025915 | A1 | 2/2012 | Ui |
| 2012/0092074 | A1 | 4/2012 | Yanduru et al. |
| 2012/0105147 | A1 | 5/2012 | Harris et al. |
| 2012/0319780 | A1 | 12/2012 | Wilson et al. |
| 2013/0093534 | A1 | 4/2013 | Mei |
| 2013/0154729 | A1 | 6/2013 | Folkmann et al. |
| 2014/0118070 | A1 | 5/2014 | Wilson et al. |
| 2014/0132343 | A1 | 5/2014 | Colantonio et al. |
| 2014/0146917 | A1 | 5/2014 | Muhammad |
| 2014/0218116 | A1 | 8/2014 | Cui et al. |
| 2015/0002227 | A1 | 1/2015 | Pribble et al. |
| 2015/0002230 | A1 | 1/2015 | Qureshi |
| 2015/0091651 | A1 | 4/2015 | Seneviratne et al. |
| 2015/0155838 | A1 | 6/2015 | Embar et al. |
| 2015/0180428 | A1 | 6/2015 | Pham et al. |
| 2016/0036398 | A1 | 2/2016 | Li |
| 2016/0268976 | A1 | 9/2016 | Negra et al. |
| 2016/0336903 | A1* | 11/2016 | Ahmed ................. H03F 3/211 |
| 2017/0016322 | A1 | 1/2017 | Hagenbuch |
| 2017/0019071 | A1 | 1/2017 | Kobayashi et al. |
| 2017/0070193 | A1 | 3/2017 | Juang et al. |
| 2017/0085228 | A1 | 3/2017 | Adbo et al. |
| 2017/0163221 | A1* | 6/2017 | Takagi ................. H03F 3/604 |
| 2018/0026583 | A1 | 1/2018 | Yanduru et al. |
| 2018/0034418 | A1 | 2/2018 | Blednov |
| 2018/0034419 | A1 | 2/2018 | Moronval |
| 2018/0183388 | A1 | 6/2018 | Pham |
| 2018/0191309 | A1 | 7/2018 | McLaren |
| 2018/0233578 | A1 | 8/2018 | Shi et al. |
| 2018/0254748 | A1 | 9/2018 | Grebennikov et al. |
| 2019/0036487 | A1 | 1/2019 | Jiang |
| 2019/0356277 | A1 | 11/2019 | Bouisse et al. |
| 2020/0212847 | A1 | 7/2020 | Pham et al. |
| 2021/0013572 | A1 | 1/2021 | Zhu |

FOREIGN PATENT DOCUMENTS

| | | |
|---|---|---|
| CN | 102545788 A | 7/2012 |
| CN | 102577104 A | 7/2012 |
| CN | 103415993 A | 11/2013 |
| CN | 103457541 A | 12/2013 |
| CN | 102549915 A | 4/2015 |
| CN | 104660176 A | 5/2015 |
| CN | 104704747 A | 6/2015 |
| CN | 105322893 A | 2/2016 |
| CN | 105637759 A | 6/2016 |
| CN | 106357222 A | 1/2017 |
| CN | 110785928 A | 2/2020 |
| CN | 107210713 B | 3/2022 |
| EP | 2442444 B1 | 4/2012 |
| EP | 2458730 A1 | 5/2012 |
| EP | 2698918 A1 | 2/2014 |
| EP | 2806557 A1 | 11/2014 |
| EP | 2876810 A1 | 5/2015 |
| EP | 3121960 A1 | 1/2017 |
| EP | 3133735 A1 | 2/2017 |
| EP | 3179628 A2 | 6/2017 |
| EP | 3179638 A1 | 6/2017 |
| EP | 3054589 B1 | 7/2018 |
| JP | 2012222624 A | 11/2012 |
| TW | I336996 B | 2/2011 |
| TW | I377783 B | 11/2012 |
| TW | I462469 B | 11/2014 |
| TW | 201611514 A | 3/2016 |
| WO | 2009027916 A2 | 3/2009 |
| WO | 2015176077 A2 | 11/2015 |
| WO | 2017192075 A1 | 11/2017 |
| WO | 2018142176 A1 | 8/2018 |
| WO | 2018142177 A1 | 8/2018 |
| WO | 2018142178 A1 | 8/2018 |
| WO | 2018197917 A1 | 11/2018 |
| WO | 2018197918 A1 | 11/2018 |
| WO | 2018197919 A1 | 11/2018 |
| WO | 2019036499 A1 | 2/2019 |
| WO | 2019069115 A1 | 4/2019 |
| WO | 2020072898 A1 | 4/2020 |
| WO | 2021137951 A1 | 7/2021 |

OTHER PUBLICATIONS

Summons to Attend Oral Proceedings in European Application No. 17726354.8 dated Feb. 23, 2023.
Summons to Attend Oral Proceedings in European Application No. 17728258.9 dated Feb. 23, 2023.
Barthwal Ayushi et al, "A Design Strategy for Bandwidth Enhancement in Three-Stage Doherty Power Amplifier With Extended Dynamic Range", IEEE Transactions on Microwave Theory and Techniques, Plenum, USA, vol. 66, No. 2, ISSN 0018-9480, Feb. 2018.
Office Action in CN Application No. 201780092425.1, dated Jan. 10, 2023, With Summary.
Translation of Office Action in TW Patent Application No. 107103832, with Search Report dated Feb. 25, 2021.

(56) References Cited

OTHER PUBLICATIONS

Daekyu Yu et al, "Fully Integrated Doherty Power Amplifiers for 5 GHz Wireless-LANs", Radio Frequency Integrated Circuits (RFIC) Symposium, 2006 IEEE, IEEE, Piscataway, NJ, USA, (Jun. 11, 2006), doi:10.1109/RFIC.2006.1651114, ISBN 978-0-7803-9572-5, pp. 153-156.
Daniel Popp et al, "High Power and High Bandwidth Digital Three-Way Doherty Power Amplifier", 2019 IEEE 20th Wireless and Microwave Technology Conference (WAMICON), IEEE, (Apr. 8, 2019), doi:10.1109/WAMICON.2019.8765455, pp. 1-6, XP033577671.
Office Action in TW Application No. 107103822, with Search Report, dated Feb. 24, 2021, with Translation.
C.F. Campbell, "A fully integrated Ku-band Doherty amplifier MMIC", IEEE Microwave and Guided Wave Letters., US, (Mar. 1, 1999), vol. 9, No. 3, doi:10.1109/75.761678, ISSN 1051-8207, pp. 114-116, XP055408528.
Xia Jing et al, "Improved Three-Stage Doherty Amplifier Design With Impedance Compensation in Load Combiner for Broadband Applications", IEEE Transactions on Microwave Theory and Techniques, Plenum, USA, vol. 67, No. 2, doi:10.1109/TMTT.2018.2884404, ISSN 0018-9480, (Feb. 1, 2019), pp. 778-786.
Vigneau et al, "Fully integrated three-way LDMOS Doherty PAs for 1.8-2.2 GHz dual-band and 2.6 GHz m-MIMO 5G applications," Published in International Journal of Microwave and Wireless Technologies, Mar. 1, 2021.
International Search Report and Written Opinion in Application No. PCT/US2020/060158, dated Mar. 10, 2021.
Office Action from European Application No. 17734137.7 dated Aug. 9, 2021.
Office Action for Taiwanese Application No. 107113817 dated Oct. 6, 2021, with Translation.
Office Action from European Application No. 17732555.2 dated Aug. 11, 2021.
Office Action for European Application No. 17825920.6 dated Dec. 1, 2021.
Office Action in TW Patent Application No. 107113817 dated Jan. 21, 2021, with Translation.
Office Action in CN Patent Application No. 2017800924285, dated Dec. 23, 2022, with Translation.
Office Action in TW Application No. 107103816, with Search Report, dated Feb. 25, 2021, with Translation.
Office Action in EP 17726356.3, dated May 20, 2021.
Office Action in EP 18759225.8, dated Oct. 27, 2021.
Grebennikov et al., High-Efficiency Doherty Power Amplifiers: Historical Aspect and Modem Trends. Proceedings of the IEEE. Dec. 2012; 100(12):3190-219.
Andrei Grebennikov, "A high-efficiency 100-W four-stage Doherty GaN HEMT power amplifier module for WCDMA systems", 2011 IEEE MTT-S International Microwave Symposium (Year: 2011).
International Search Report and Written Opinion for Application No. PCT/IB2017/000727 dated Oct. 19, 2017.
International Search Report and Written Opinion for Application No. PCT/IB2017/000608 dated Sep. 8, 2017.
International Preliminary Report on Patentability for International Application No. PCT/IB2017/000608, dated Oct. 29, 2019.
International Search Report and Written Opinion for Application No. PCT/IB2017/000717 dated Dec. 6, 2017.
International Preliminary Report on Patentability for International Application No. PCT/IB2017/000717, dated Aug. 6, 2019.
International Search Report and Written Opinion for Application No. PCT/IB2017/000722 dated Nov. 7, 2017.
International Preliminary Report on Patentability for International Application No. PCT/IB2017/000722, dated Aug. 6, 2019.
International Search Report and Written Opinion for Application No. PCT/US2017/068164 dated Mar. 13, 2018.
International Preliminary Report on Patentability for International Application No. PCT/US2017/068164 dated Apr. 3, 2019.
Office Action from European Application No. 17726354.8 dated May 27, 2021.
International Search Report and Written Opinion for Application No. PCT/IB2018/046754 dated Nov. 22, 2018.
International Search Report and Written Opinion for Application No. PCT/IB2017/001575 dated Jun. 18, 2018.
International Search Report and Written Opinion for Application No. PCT/IB2017/000639 dated Sep. 8, 2017.
International Preliminary Report on Patentability for International Application No. PCT/IB2017/000639, dated Oct. 29, 2019.
International Search Report and Written Opinion for Application No. PCT/IB2017/000604 dated Sep. 8, 2017.
International Preliminary Report on Patentability for International Application No. PCT/IB2017/000604 dated Oct. 29, 2019.
International Search Report and Written Opinion for International Application No. PCT/US2019/054686, dated Dec. 19, 2019.
Camarchia et al., 7 Ghz MMIC GaN Doherty Power Amplifier With 47% Efficiency at 7 dB Output Back-Off. IEEE Microwave and Wireless Components Letters. Jan. 2013; 23(1):34-6.
Campbell, A Fully Integrated Ku-Band Doherty Amplifier MMIC. IEEE Microwave and Guided Wave Letters. Mar. 1999; 9(3):114-6.
Cidronali et al., Frequency Analysis and Multiline Implementation of Compensated Impedance Inverter for Wideband Doherty High-Power Amplifier Design. IEEE Transactions on Microwave Theory and Techniques. May 2016;64(5):1359-72.
Kim et al., Doherty Linear Power Amplifiers for Mobile Handset Applications. Proceedings of Asia-Pacific Microwave Conference. Dec. 2006;1885-94.
Merrick et al., A wideband sequential power amplifier. 2014 IEEE MTT-S International Microwave Symposium (IMS2014). Jun. 1, 2014:1-3.
Moronval et al., A 100 W Multi-Band Four-Way Integrated Doherty Amplifier. IEEE MTT-S International Microwave Symposium (IMS) May 22, 2016:1-3.
Quaglia et al., K-Band GaAs MMIC Doherty Power Amplifier for Microwave Radio With Optimized Driver. IEEE Transactions on Microwave Theory and Techniques. Nov. 2014;62(11):2518-25.
Roberts, Understanding the 3 Level Doherty. 11th European Microwave Integrated Circuits Conference (EUMIC), European Microwave Association. Oct. 3, 2016:428-32.
Wicks et al., A 60-GHz Fully-Integrated Doherty Power Amplifier Based on 0.13-µm CMOS Process. Radio Frequency Integrated Circuits Symposium. Jun. 17, 2008;69-72.
Yu et al., Fully Integrated Doherty Power Amplifiers for 5 GHz Wireless-LANs. IEEE Radio Frequency Integrated Circuits Symposium (RFIC). Jun. 11, 2006;153-6.
Zhou et al., Design of an S-Band Two-Way Inverted Asymmetrical Doherty Power Amplifier for Long Term Evolution Applications. Progress in Electromagnetics Research Letters. Apr. 2013;39:73-80.
Non-Final Office Action for U.S. Appl. No. 16/607,083 dated Feb. 23, 2021.
Daehyun Kang et al: "30.3% PAE HBT Doherty power amplifier for 2.5~ 2.7 GHz mobile WiMAX", Microwave Symposium Digest (MTT), 2010 IEEE MTT-S International, IEEE, Piscataway, NJ, USA, May 23, 2010, pp. 796-799, XP031714062,ISBN: 978-1-4244-6056-4.
Office Action from European Application No. 17728258.9 dated May 27, 2021.
Search Report for Taiwanese Application No. 107113802 dated May 26, 2021.
International Preliminary Report on Patentability for International Application No. PCT/IB2018/046754 dated Feb. 27, 2020.

* cited by examiner

INVERTED DOHERTY POWER AMPLIFIER WITH LARGE RF FRACTIONAL AND INSTANTANEOUS BANDWIDTHS

CROSS REFERENCE TO RELATED APPLICATIONS

This application is a continuation of U.S. Non-Provisional application Ser. No. 16/607,083, filed Oct. 21, 2019, which is a national stage application of International Application No. PCT/IB2017/00604, filed Apr. 24, 2017, the entire contents of both of which applications are hereby incorporated herein by reference.

BACKGROUND

Technical Field

The technology relates to high-speed, high-power, broad-bandwidth, Doherty amplifiers.

Discussion of the Related Art

High-speed power amplifiers formed from semiconductor materials have a variety of useful applications, such as radio-frequency (RF) communications, radar, RF energy, and microwave applications. Gallium nitride semiconductor material has received appreciable attention in recent years because of its desirable electronic and electro-optical properties. GaN has a wide, direct bandgap of about 3.4 eV that corresponds to the blue wavelength region of the visible spectrum. Because of its wide bandgap, GaN is more resistant to avalanche breakdown and can maintain electrical performance at higher temperatures than other semiconductors, such as silicon. GaN also has a higher carrier saturation velocity compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN is useful for high-speed, high-voltage, and high-power applications.

Applications supporting mobile communications and wireless interne access under current and proposed communication standards, such as WiMax, 4G, and 5G, can place austere performance demands on high-speed amplifiers constructed from semiconductor transistors. The amplifiers may need to meet performance specifications related to output power, signal linearity, signal gain, bandwidth, and efficiency.

SUMMARY

Apparatus and methods for improving the performance of high-speed, high-power, broad-band, amplifiers are described. The structures and methods relate to circuitry for combining amplified signals in an inverted Doherty amplifier. Impedance-matching components, impedance of an impedance inverter (sometimes referred to as a delay line or offset line), phase delay of the impedance inverter, and impedance at a combining node of the inverted Doherty amplifier may be configured to appreciably improve the amplifier's RF fractional bandwidth ($\Delta\omega/\omega_o$) and signal bandwidth (also referred to as "instantaneous bandwidth") for both symmetrical inverted Doherty amplifiers and asymmetrical inverted Doherty amplifiers.

Some embodiments relate to An inverted Doherty amplifier comprising a main amplifier in a first circuit branch, a peaking amplifier in a second circuit branch arranged to operate as a class C amplifier, a combining node located where a first portion of the first circuit branch after the main amplifier connects with a second portion of the second circuit branch after the peaking amplifier, a first impedance-matching component connected in the first portion of the first circuit branch between the main amplifier and the combining node, wherein the first impedance-matching component transforms an input impedance of $Z_{opt}$ to an output impedance of $R_{comb}$ that is within 30% of a value determined by the following expression $$\sqrt{Z_{optm} R_L (1+\alpha)}$$

where $Z_{optm}$ is an impedance load for the main amplifier that, when connected at an output of the main amplifier, would provide maximum power transfer from the main amplifier, $R_L$ is a resistance of a load to be driven by the inverted Doherty amplifier, and $\alpha$ is an asymmetry factor for the inverted Doherty amplifier, wherein the asymmetry factor is a ratio of a maximum power output by the peaking amplifier to a maximum power output by the main amplifier, and an output port connected to the combining node and configured to connect to an external circuit with no impedance-matching component located between the output port and the combining node.

In some aspects, $Z_{optm}$ consists of a real resistance $R_{optm}$ and the impedance value $R_{comb}$ is within 20% of the expression in the preceding paragraph. In some cases, an inverted Doherty amplifier may further comprise an impedance inverter connected in the second circuit branch between the peaking amplifier and the combining node, wherein the impedance inverter comprises a microstrip transmission line. In some implementations, the microstrip transmission line has a characteristic impedance that is approximately equal to the impedance at the combining node multiplied by $(1+\alpha)/\alpha$. In some aspects, the impedance inverter adds a phase delay of approximately 270 degrees.

According to some implementations, an RF fractional bandwidth of an inverted Doherty amplifier, defined by an S11 scattering parameter at the output of the main amplifier looking toward the combining node with the peaking amplifier in a non-amplifying state, is between 7% and 25% when an asymmetry factor for the inverted Doherty amplifier is 1.

In some cases, the combining node of an inverted Doherty amplifier is arranged to connect directly to a load having an impedance approximately equal to 50 ohms.

Some implementations of an inverted Doherty amplifier may further comprise a coupler arranged to divide an input signal into a first signal provided to the first circuit branch and a second signal provided to the second circuit branch and to add a first phase delay to the first signal with respect to the second signal by more than 80 degrees, and a second impedance-matching component connected in the second portion of the second circuit branch between the peaking amplifier and the impedance inverter.

In some aspects, an inverted Doherty amplifier may further comprise a first shunt inductor and a first capacitor in the first impedance-matching component connected in series between an output from the main amplifier and a first reference potential, and a second shunt inductor and a second capacitor in the second impedance-matching component connected in series between an output from the peaking amplifier and a second reference potential.

An inverted Doherty amplifier may also include a first biasing terminal connected to the first shunt inductor and arranged to provide a first biasing path for applying a first bias voltage to the main amplifier via the first shunt inductor, and a second biasing terminal connected to the second shunt inductor and arranged to provide a second biasing path for applying a second bias voltage to the peaking amplifier via the second shunt inductor. In some aspects, a value of the first capacitor is between 100 picoFarads and 10 microFarads.

In some implementations, the impedance inverter adds a second phase delay that is approximately equal to the first phase delay. In some cases, the impedance inverter adds a second phase delay that is approximately equal to an odd multiple of 90 degrees.

According to some implementations, the first impedance-matching component and the second impedance-matching component each provide approximately 90 degrees of phase delay.

In some cases, the main amplifier and the peaking amplifier comprise gallium-nitride transistors.

Some embodiments relate to methods of operating an inverted Doherty amplifier. A method may comprise acts of receiving an input signal; dividing the input signal; providing a first portion of the input signal to a first circuit branch containing a main amplifier; providing a second portion of the input signal to a second circuit branch containing a peaking amplifier that operates as a class C amplifier; transforming, with a first impedance-matching component connected in the first portion of the first circuit branch between the main amplifier and the combining node, an input impedance of $Z_{opt}$ to an output impedance of $R_{comb}$ that is within 30% of a value determined by the following expression $$\sqrt{Z_{optm}R_L(1+\alpha)}$$

where $Z_{optm}$ is an impedance load for the main amplifier that, when connected at an output of the main amplifier, would provide maximum power transfer from the main amplifier, $R_L$ is a resistance of a load driven by the inverted Doherty amplifier, and $\alpha$ is an asymmetry factor for the inverted Doherty amplifier, wherein the asymmetry factor is a ratio of a maximum power output by the peaking amplifier to a maximum power output by the main amplifier; combining signals from the first circuit branch after the main amplifier and the second circuit branch after the peaking amplifier at a combining node; and providing an output signal from the combining node to an output port that is connected to the combining node and configured to connect to an external circuit with no impedance-matching component located between the output port and the combining node.

In some cases, a method may further comprise providing an amplified signal from the peaking amplifier to a second impedance-matching component; and providing a signal from the second impedance-matching component to an impedance inverter that delays the signal from the second impedance-matching component by a value that is approximately equal to an odd multiple of 90 degrees.

In some aspects, the impedance inverter is an integrated transmission line and the delay is approximately 270 degrees. In some implementations, the impedance inverter is an integrated microstrip transmission line having a characteristic impedance that is determined approximately by the following expression $$\frac{1}{\alpha}\sqrt{Z_{optm}R_L(1+\alpha)}.$$

A method of operating an inverted Doherty amplifier may further comprise applying a drain-to-source voltage to a transistor of the main amplifier via a shunt inductor that is located in the first impedance-matching component and connected in series with a decoupling capacitor between an RF signal path from the main amplifier and a reference potential.

In some aspects, a method further comprises providing a combined signal from the combining node via the output port to an external load that has an impedance of approximately 50 ohms.

Some embodiments relate to an inverted Doherty amplifier comprising a main amplifier in a first circuit branch, a peaking amplifier in a second circuit branch arranged to operate as a class C amplifier, a combining node located where a first portion of the first circuit branch after the main amplifier connects with a second portion of the second circuit branch after the peaking amplifier, an impedance inverter located in the second circuit branch between the peaking amplifier and the combining node, wherein the impedance inverter comprises an integrated transmission line having a characteristic impedance that is within 30% of a value determined by the following expression $$\frac{1}{\alpha}\sqrt{Z_{optm}R_L(1+\alpha)}$$

where $Z_{optm}$ is an impedance load that, when connected at an output of the main amplifier, would provide maximum power transfer from the main amplifier, $R_L$ is a resistance of a load to be driven by the inverted Doherty amplifier, and $\alpha$ is an asymmetry factor for the inverted Doherty amplifier, wherein the asymmetry factor is a ratio of a maximum power output by the peaking amplifier to a maximum power output by the main amplifier, and an output port connected to the combining node and configured to connect to an external circuit with no impedance-matching component located between the output port and the combining node.

In some aspects, $Z_{optm}$ consists of a real resistance $R_{optm}$. In some cases, the impedance inverter comprises a microstrip transmission line. In some implementations, the microstrip transmission line has a characteristic impedance that is approximately equal to the impedance at the combining node multiplied by $(1+\alpha)/\alpha$. According to some implementations, the impedance inverter adds a phase delay of approximately 270 degrees.

According to some aspects, an RF fractional bandwidth of the inverted Doherty amplifier, defined by an S11 scattering parameter at the output of the main amplifier looking toward the combining node with the peaking amplifier in a non-amplifying state is between 7% and 25% when an asymmetry factor for the inverted Doherty amplifier is 1.

In some cases, the combining node is arranged to connect directly to a load having an impedance approximately equal to 50 ohms.

An inverted Doherty amplifier may further comprise a coupler arranged to divide an input signal into a first signal provided to the first circuit branch and a second signal provided to the second circuit branch and to add a first phase delay to the first signal with respect to the second signal by more than 80 degrees, a first impedance-matching component connected in the first portion of the first circuit branch between the main amplifier and the combining node, and a second impedance-matching component connected in the second portion of the second circuit branch between the peaking amplifier and the impedance inverter.

In some cases, an inverted Doherty amplifier may further comprise a first shunt inductor and a first capacitor in the first impedance-matching component connected in series between an output from the main amplifier and a first reference potential, and a second shunt inductor and a second capacitor in the second impedance-matching component connected in series between an output from the peaking amplifier and a second reference potential.

In some implementations, an inverted Doherty amplifier further comprises a first biasing terminal connected to the first shunt inductor and arranged to provide a first biasing path for applying a first bias voltage to the main amplifier via the first shunt inductor, and a second biasing terminal connected to the second shunt inductor and arranged to provide a second biasing path for applying a second bias voltage to the peaking amplifier via the second shunt inductor. A value of the first capacitor may between 100 picoFarads and 10 microFarads.

In some aspects, the first impedance-matching component is configured to transform an input impedance of $Z_{opt}$ to an output impedance of $R_{comb}$ that is within 30% of a value determined by the following expression $$\sqrt{Z_{optm} R_L (1+\alpha)}.$$

In some cases, the impedance inverter adds a second phase delay that is approximately equal to the first phase delay. In some implementations, the impedance inverter adds a second phase delay that is approximately equal to an odd multiple of 90 degrees. According to some aspects, the first impedance-matching component and the second impedance-matching component each provide approximately 90 degrees of phase delay.

In some cases, the main amplifier and the peaking amplifier comprise gallium-nitride transistors.

Some embodiments relate to methods of operating an inverted Doherty amplifier. A method may comprise acts of receiving an input signal; dividing the input signal; providing a first portion of the input signal to a first circuit branch containing a main amplifier; providing a second portion of the input signal to a second circuit branch containing a peaking amplifier that operates as a class C amplifier; providing a signal in the second circuit branch after the peaking amplifier to an impedance inverter, wherein the impedance inverter comprises an integrated transmission line having a characteristic impedance that is within 30% of a value determined by the following expression $$\frac{1}{\alpha}\sqrt{Z_{optm} R_L (1+\alpha)}$$

where $Z_{optm}$ is an impedance load that, when connected at an output of the main amplifier, would provide maximum power transfer from the main amplifier, $R_L$ is a resistance of a load to be driven by the inverted Doherty amplifier, and $\alpha$ is an asymmetry factor for the inverted Doherty amplifier, wherein the asymmetry factor is a ratio of a maximum power output by the peaking amplifier to a maximum power output by the main amplifier; combining signals from the first circuit branch after the main amplifier and the second circuit branch after the peaking amplifier at a combining node; and providing an output signal from the combining node to an output port that is connected to the combining node and configured to connect to an external circuit with no impedance-matching component located between the output port and the combining node.

In some aspects, a method may further comprise transforming, with a first impedance-matching component connected in the first portion of the first circuit branch between the main amplifier and the combining node, an input impedance of $Z_{opt}$ to an output impedance of $R_{comb}$ that is within 30% of a value determined by the following expression $$\sqrt{Z_{optm} R_L (1+\alpha)}.$$

In some implementations, a method may further comprise providing an amplified signal from the peaking amplifier to a second impedance-matching component; and providing a signal from the second impedance-matching component to the impedance inverter that delays the signal from the second impedance-matching component by a value that is approximately equal to an odd multiple of 90 degrees.

In some cases, a method may further comprise applying a drain-to-source voltage to a transistor of the main amplifier via a shunt inductor that is located in the first impedance-matching component and connected in series with a decoupling capacitor between an RF signal path from the main amplifier and a reference potential.

In some aspects, a method further comprises delaying, by the impedance inverter, the signal in the second circuit branch by approximately 270 degrees.

In some implementations, a method further comprises providing the output signal to an external load that has an impedance of approximately 50 ohms.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for to illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Figure 1:
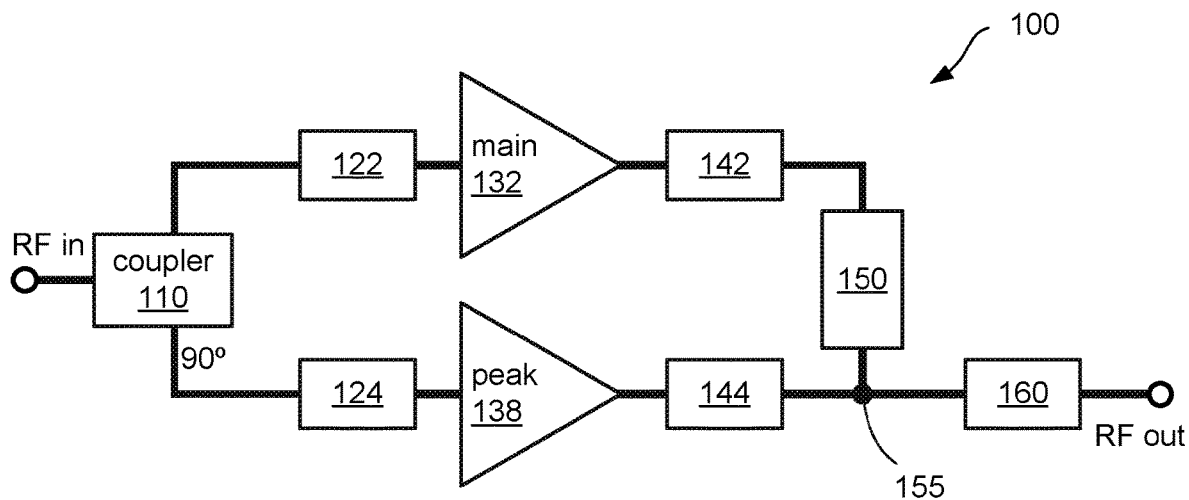
FIG. 1 depicts an arrangement of a conventional Doherty amplifier.

Features and advantages of the illustrated embodiments will become more apparent from the detailed description set forth below when taken in conjunction with the drawings.

DETAILED DESCRIPTION

Among the different types of amplifiers available, Doherty amplifiers are well-suited for RF communication applications. Certain RF communication protocols, such as wideband code division multiple access and orthogonal frequency division multiplexing, typically have signals with high peak-to-average power ratios. For such systems, amplifier linearity is important. However, maintaining amplifier linearity with a single stage amplifier over large signal power ranges results in poor amplifier efficiency. A Doherty amplifier 100, depicted in FIG. 1, can improve power efficiency by using tandem amplifiers: a main amplifier 132 (operating in class AB or class B mode) and a peaking amplifier 138 (operating in class C mode). Although the main amplifier and the peaking amplifier may be of a same design, the peaking amplifier 138 is controlled (e.g., by gate bias) such that it is off (not providing amplification) when the input signal is below a predetermined power level, and is on (providing signal amplification) when the input signal to the Doherty amplifier rises above the predetermined power level. The turn-on point for the peaking amplifier 138 is selected to occur approximately when the gain of the main amplifier 132 starts to saturate.

In a Doherty amplifier, the main amplifier 132 and a peaking amplifier 138 are arranged on parallel circuit branches with other components. An input signal applied to an input port, for example, is split by a 90-degree coupler 110 that provides an in-phase attenuated signal to the main amplifier and an attenuated signal rotated by 90 degrees (typically delayed by 90°) to the peaking amplifier. In various embodiments, the input signal is in the radio-frequency (RF) range between about 500 MHz and 7 GHz. The coupler 110 may divide the input signal substantially equally, so that the attenuation of each signal to the parallel circuit branches is approximately 3 dB in signal power.

After the main amplifier 132 and located in the main amplifier circuit branch, there may be an impedance inverter 150 that includes a 90-degree delay (also referred to as quarter-wavelength delay). The impedance inverter 150 compensates for the 90-degree delay added by the coupler 110 to the peaking amplifier circuit branch so that the signals recombine with near the same phase. The signals from the two parallel circuit branches are combined at a combining node 155 and provided to an output signal port. An output impedance-matching component 160 may be connected between the combining node and the output port and designed to match the output impedance of the Doherty amplifier 100 to the impedance of a load (not shown).

Impedance-matching components 122, 124 may be placed before the main amplifier 132 and peaking amplifier 138 in a Doherty amplifier 100. These matching components may be used to match the impedances of the transmission lines from the 90-degree coupler 110 to the input impedances of the two amplifiers, so that signal reflections from the amplifiers are reduced or essentially eliminated. Additional impedance-matching components 142, 144 may be placed at the outputs of the main and peaking amplifiers to match impedances between the outputs of the main and peaking amplifiers to subsequent impedance values in the output circuit, e.g., to the input impedance of the impedance inverter 150 which may be 50 ohms.

The inventors have recognized and appreciated that a Doherty amplifier 100 having the configuration depicted in FIG. 1 has bandwidth limitations associated with the circuit's topology. The bandwidth limitations are due in part to a long electrical path length added by the impedance-matching components 122, 124, 142, 144. Because of the added electrical path length, it typically is not possible for the impedance inverter 150 to employ only a 90-degree rotation to compensate for the phase rotation introduced by the 90° coupler. Instead, an odd multiple of 90° is used at the impedance inverter 150, such as 270°. The inventors have found that higher multiples of 90° result in increasingly narrower bandwidth performance of the Doherty amplifier 100.

Figure 2:
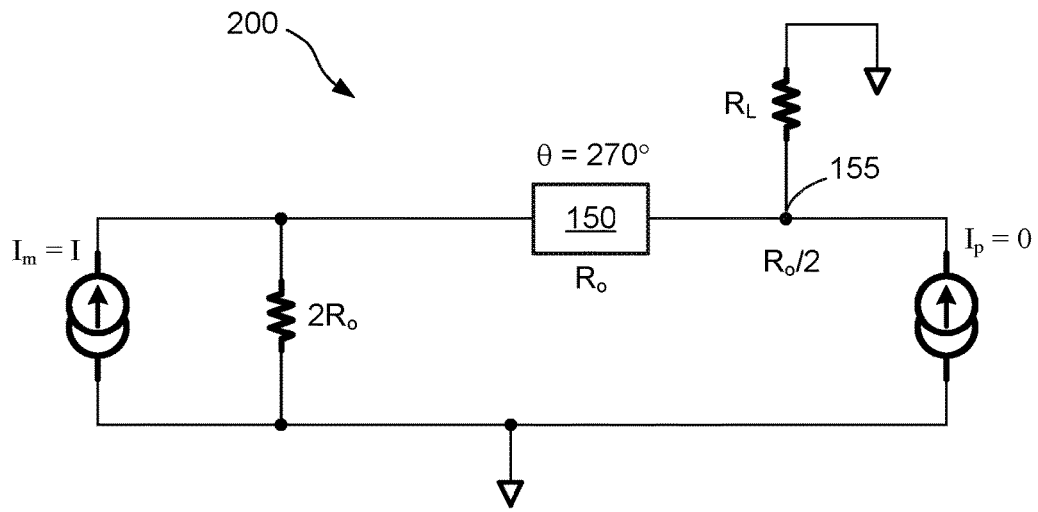
FIG. 2 depicts an equivalent circuit for a Doherty amplifier operating at low output powers.

To investigate the cost in bandwidth performance of a Doherty amplifier 100 due to the impedance-matching components, high-frequency simulations were performed using a low-power circuit model 200, which is depicted in FIG. 2. The low-power circuit model represents times during operation of the Doherty amplifier 100 when the peaking amplifier 138 (modeled as current source $I_p$) is in an idle state and not providing amplification. When the peaking amplifier is off, it appreciably alters the impedance (modulates the load) seen by the main amplifier 132 and therefore affects the frequency-dependent reflection coefficient at the output of the main amplifier. Accordingly, low-power operation can constrain the rated RF fractional bandwidth ($\Delta\omega/\omega_o$) for a Doherty amplifier, e.g., a guaranteed bandwidth for all signal levels.

In the low-power circuit model 200 of FIG. 2, the main amplifier 132 is represented as a first current source $I_m$ and the peaking amplifier 138 is represented as a second current source $I_p$, which outputs no current. The impedance inverter 150 is modeled as a transmission line having a resistance of 50 ohms and a phase rotation of 270° at the center frequency of operation (2 GHz for this simulation). In the simulation, the frequency is swept over a range of frequencies around the center frequency. The impedance at the combining node is fixed at $R_o/2$, looking toward the load, where $R_o$ is a selected impedance to obtain maximum power output from the main amplifier under full load conditions. For purposes of the simulations, the impedance of the peaking amplifier when off is set to a value of $20R_o$. For these simulations, $R_o=2R_L=100\Omega$.

Simulations of circuits and circuit elements described herein can be implemented using a software tool such as Advanced Design System (ADS) available from Keysight Technologies, Inc. of Santa Rosa, California Other suitable software tools include, but are not limited to NI AWR Design Environment available from AWR Corporation of El Segundo, California and Sonnet® software tools available from Sonnet Software of North Syracuse, New York.

Figure 3:
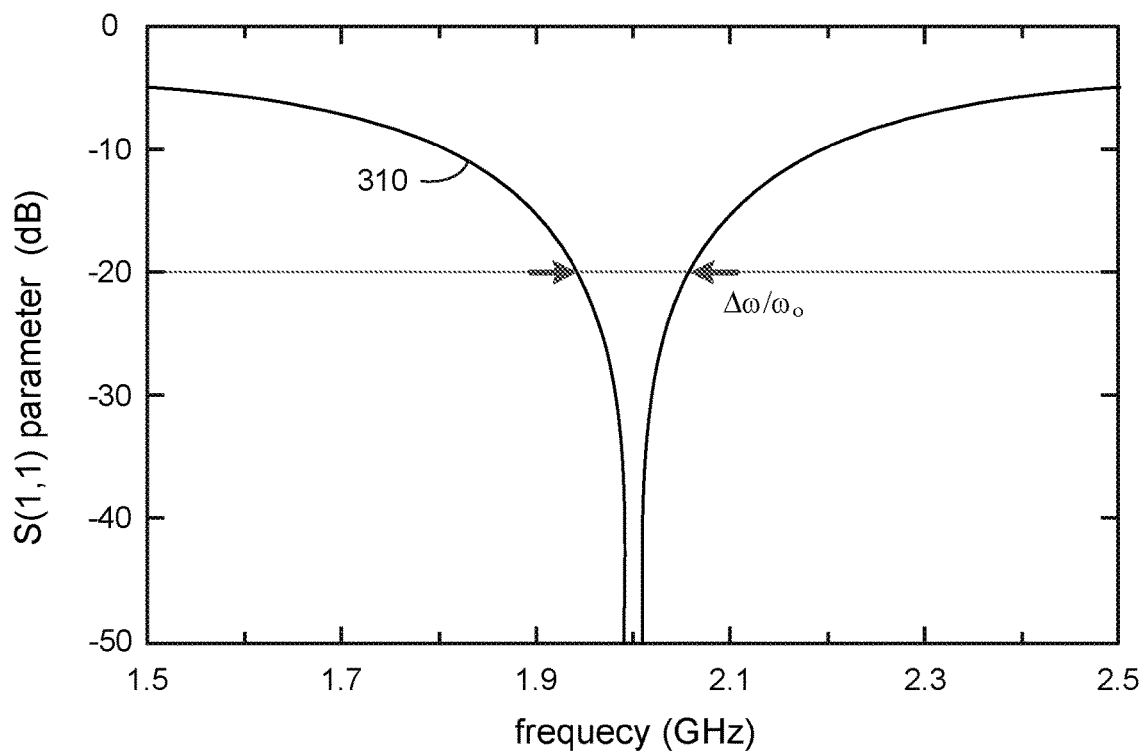
FIG. 3 plots a frequency-response curve for a Doherty amplifier, according to some embodiments.

Results from the simulations of a Doherty amplifier 100 and modeled as in FIG. 2 are shown in FIG. 3. The frequency-response curve 310 plotted in the graph represents the scattering parameter $S_{11}$ evaluated looking from the output of the main amplifier 132 (e.g. the current source $I_m$) into the impedance inverter 150. The frequency-response curve 310 can be used to determine an amount of signal reflected back to the main amplifier (e.g., voltage-to-standing-wave ratio or voltage reflection coefficient) as a function of frequency. For purposes of evaluating amplifier performance, an RF fractional bandwidth $(\Delta\omega/\omega_o)$ for the amplifier may be determined from a frequency difference $\Delta\omega$ between the −20 dB points on the frequency-response curve where the value of the back-reflected signal rises to 20 dB below the signal level input to the impedance inverter. For the example shown, the RF fractional bandwidth is approximately 6%. If the added electrical path introduced by the impedance-matching components is greater, then the phase delay of the impedance inverter 150 becomes larger and the RF fractional bandwidth reduces further. Conventional Doherty amplifiers for RF communication systems typically operate with RF fractional bandwidths less than about 4%. The inventors have recognized that these RF fractional bandwidth values will not be suitable for future broadband RF communication systems.

Figure 4:
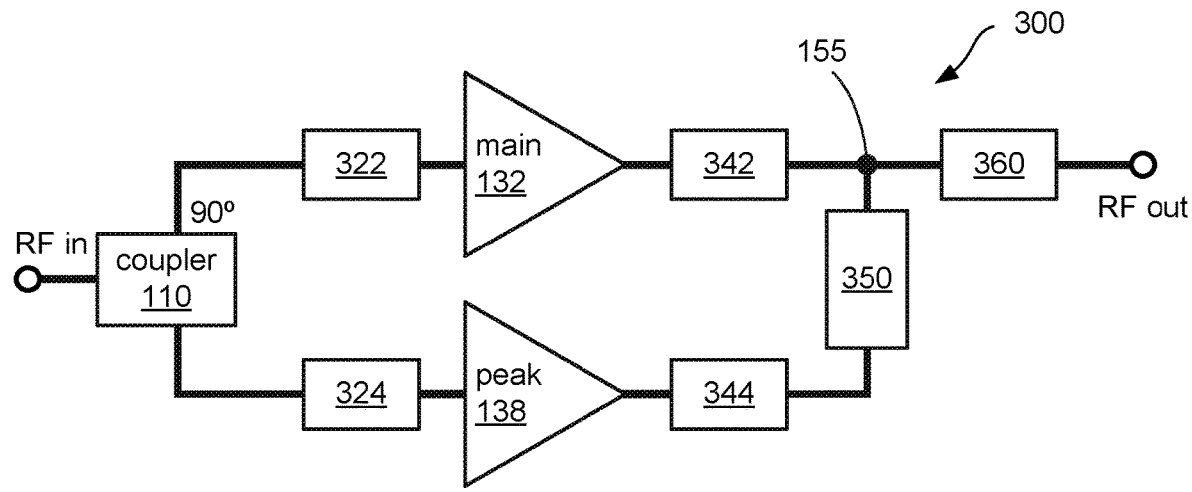
FIG. 4 depicts an inverted Doherty amplifier in which an impedance inverter at the output of the amplifiers is located between the peaking amplifier and combining node, according to some embodiments.

The inventors have recognized and appreciated that carefully designed inverted Doherty amplifier configurations can provide significantly larger RF fractional bandwidths than a conventional Doherty amplifier. FIG. 4 depicts inverted Doherty amplifier topology, according to some embodiments. In an inverted Doherty amplifier, a 90° phase delay at the coupler 110 is provided to the signal going to the main amplifier 132, and an impedance inverter 350 is located between the combining node 155 and the peaking amplifier 138 (compare with FIG. 1).

In overview and according to some embodiments, an inverted Doherty amplifier 300 comprises an input coupler 110, a main amplifier 132 in a first circuit branch, a peaking amplifier 138 in a second circuit branch, a combining node 155 at which the first circuit branch and the second circuit branch connect, a first impedance-matching component 342 connected between an output of the main amplifier 132 and the combining node 155, a second impedance-matching component 344 connected between an output of the peaking amplifier 138 and the combining node 155. An inverted Doherty amplifier 300 also includes an impedance inverter 350 connected between the second impedance-matching component 344 and the combining node 155. The inverted Doherty amplifier 300 may further include an output impedance-matching component 360 located between the combining node 155 and an output port or terminal.

The components of an inverted Doherty amplifier 300 may be assembled in a sealed package as an RF amplifier. For example, an inverted Doherty amplifier may be assembled on a high-speed circuit board (e.g., printed circuit board, ceramic circuit board, or high-frequency laminate such as model RO4003® available from Rogers Corporation of Chandler, Arizona) and overmolded or sealed in a housing. External connections may be provided for an input signal, an output signal, and biasing of the amplifier. Heat-sinking capability may also be provided (e.g., a metal or thermally-conductive base plate that can mount to a heat dissipating element). In some implementations, an inverted Doherty amplifier 300 may be assembled on an open circuit board that is configured to connect to electronic equipment in any suitable manner (e.g., plug into a board slot).

In further detail, the input coupler 110 may be any suitable power coupler (e.g., a 90-degree hybrid coupler) that divides the input signal into two signals having approximately equal power levels. Each of the divided signals may have a power level that is approximately 3 dB less than the input RF signal. One of the two signals, provided to the first circuit branch and main amplifier is delayed by approximately 90 degrees by the coupler with respect to the signal provided to the second circuit branch. For example, a phase of a sinusoidal signal at a rated carrier frequency for the amplifier is delayed by approximately 90 degrees at a first output port of the coupler 110 that connects to the first circuit branch with respect to a second output port of the coupler that connects to the second circuit branch. In some embodiments, an isolated port (not shown) of the coupler 110 may be terminated by a 50-ohm load.

The main amplifier 132 and the peaking amplifier 138 may comprise high-power semiconductor transistors, such as gallium-nitride field-effect transistors (FETs). In some implementations, the main amplifier 132 and the peaking amplifier 138 may comprise gallium-nitride high-electron-mobility transistors (HEMTs). Gallium-nitride (GaN) transistors are useful for high-speed, high-voltage, and high-power applications because of the favorable material properties of gallium nitride. In RF communications, for example, GaN transistors may be used in inverted Doherty amplifiers at a base station to amplify data signals for wireless broadcasting within a cell area covered by the base station. As used herein, the phrase "gallium nitride" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_xP_y N_{(1-x-y)}$), aluminum indium gallium arsenide phosporide nitride ($Al_xIn_yGa_{(1-x-y)}As_aP_b N_{(1-a-b)}$), amongst others. In some cases, the transistors of the main and peaking amplifiers may be formed from other semiconductor materials such as gallium arsenide, silicon carbide, silicon germanium, silicon, indium phosphide, etc. and the invention is not limited to gallium-nitride-based amplifiers.

According to some embodiments, the main amplifier 132 and the peaking amplifier 138 have an input impedance that may differ from an output impedance of the coupler 110. To approximately match impedances, impedance-matching components 322, 324 may be located in each circuit branch between the coupler 110 and the inputs to the main amplifier 132 and peaking amplifier 138.

Each impedance-matching component 322, 324, 342, 344, 360 may comprise a lumped-element network, one or more distributed devices (e.g., microstrip transmission line), or a combination of a lumped-element network and one or more distributed devices, and be configured to transform an impedance of a first value at an input to an impedance of a second value at an output. An impedance-matching component may comprise resistive, capacitive, and/or inductive circuit elements. A circuit element may be a discrete device or an integrated device. The terms "impedance-matching component" and "impedance-transforming component" may be used interchangeably and used to describe a component that transforms a first impedance value at an input to a second impedance value at an output. An impedance-matching component may comprise an RF network that transforms a first impedance at its input of a first value (e.g., approximately matched to an output impedance of the coupler 110) to a second impedance at its output of a second value (e.g., approximately matched to an input impedance of an amplifier to which it connects). The first impedance value and second impedance value are different and are selected to approximately match (e.g., within 20%) impedances at points in the circuit to which the input and output of the impedance-matching component connect. An impedance-matching component may, or may not, add phase delay.

In some embodiments, the impedance inverter 350 is formed as a distributed transmission line (e.g., a microstrip line having a predetermined characteristic impedance and predetermined phase delay). In some implementations, the impedance inverter 350 is formed as an artificial transmission line (e.g., from lumped inductive and capacitive elements). A lumped inductive element may include one or more bond wires, in some embodiments. In some cases, the impedance inverter 350 may comprise a combination of one or more distributed transmission line and lumped elements.

In some embodiments of an inverted Doherty amplifier 300, the main amplifier 132 and the peaking amplifier 138 may be operated to amplify their input signals to a same amount of maximum output power (e.g., to form a symmetrical inverted Doherty amplifier). In other cases, the main amplifier 132 and the peaking amplifier 138 may be operated or configured to amplify their input signals to different amounts of maximum output power (e.g., to form an asymmetrical inverted Doherty amplifier). In a symmetrical inverted Doherty amplifier, the main amplifier 132 and the peaking amplifier 138 may be of essentially the same design (e.g., same gate widths).

In an asymmetrical inverted Doherty amplifier, the main amplifier 132 and the peaking amplifier 138 may be of different designs or operated differently. For example, in an asymmetrical inverted Doherty amplifier, the gate width of the peaking amplifier 138 may be larger than the gate width of the main amplifier 132. Alternatively or additionally, the drain-to-source bias may be different between the main amplifier and the peaking amplifier. An asymmetrical inverted Doherty amplifier may be characterized by an asymmetry factor α, which represents a ratio of maximum power output by the peaking amplifier to a maximum power output by the main amplifier.

In both the symmetrical and asymmetrical inverted Doherty amplifiers, the main amplifier and the peaking amplifier may be biased differently at their gates. The main amplifier 132 may be biased so that it operates in class AB or class B mode, and the peaking amplifier 138 may be biased so that it operates in class C mode. In this manner, the peaking amplifier 138 may be idle (providing no amplification) at low input RF signal levels and turn on to provide amplification when the input signal level exceeds a predetermined power level.

The inventors have recognized and appreciated that configurations of the impedance-matching elements 342, 344, 360, impedance inverter 350, and the impedance at the combining node 155 can strongly influence the bandwidth of an inverted Doherty amplifier when operated in symmetric and asymmetric modes. According to some embodiments, the RF bandwidth of an inverted Doherty amplifier may be improved by setting the impedance at the combining node based on an impedance value $R_{optm}$ (or $Z_{optm}$) associated with the main amplifier 132, and also setting impedance characteristics of the impedance-matching components 342, 344, 360 and impedance inverter 350 based on $R_{optm}$ (or $Z_{optm}$). The impedance at the combining node 155 and impedance characteristics of the impedance-matching components and impedance inverter may additionally be based on an asymmetry factor α of the Doherty amplifier and a load $R_L$ driven by the Doherty amplifier.

The value of $R_{optm}$ is a real impedance value that, if connected directly to transistor drain(s) of the main amplifier 132 as a load, would provide maximum power transfer from the main amplifier's power transistor(s) to the load $R_{optm}$. The value $Z_{optm}$ would be a load impedance (having both resistive and reactive components) connected some distance from drain(s) of the main amplifier's transistor(s) for maximum power transfer. For example, in an amplifier package, there may not be direct access to the drain(s) of the main amplifier's transistor(s). Instead, there may be leads connected to the drain(s) that accumulate reactive impedance and run between the amplifier's drain(s) and an external fin, pad, or pin. Zoptm may then be determined at an output (e.g., an access point) of the main amplifier that is configured to connect external circuitry. According to some embodiments, a power amplifier may comprise multiple transistors formed on a semiconductor and configured to amplify a signal in parallel.

The value Roptm (or Zoptm) generally depends upon properties of the amplifier. For example and in some embodiments, $R_{optm}$ may be determined approximately using the following relation.

$$R_{optm} \approx 2(V_{ds}-V_k)/I_{max} \tag{EQ. 1}$$

where $V_{ds}$ is the drain-to-source bias applied to the amplifier, $V_k$ is the knee voltage for the amplifier, and $I_{max}$ is a maximum output current for the amplifier. The values for $V_{ds}$, $V_k$, and $I_{max}$ may be listed in an amplifier's operating specifications or data sheet, or be measured if one has access to the main amplifier's transistor. Other methods may be used to determine $R_{optm}$, such as using a load-pull technique or using a non-linear model of the amplifier's transistor.

Figure 5:
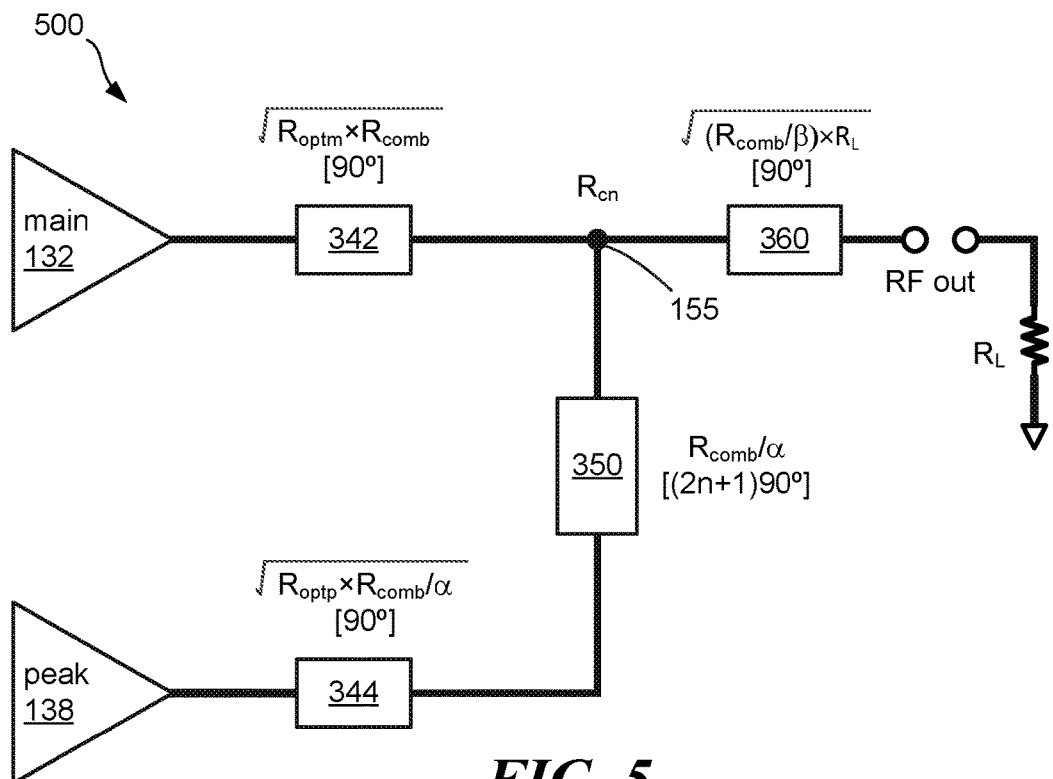
FIG. 5 depicts components of an inverted Doherty amplifier, according to some embodiments.

Further details of the output components (sometimes referred to as a load network) of an inverted Doherty amplifier are shown in FIG. 5, according to some embodiments. In some cases, the impedance-matching components 342, 344, 360 each provide approximately quarter-wave phase shifts at center frequency. According to some embodiments, the impedance inverter provides a phase shift that is approximately an odd multiple of quarter-wave at center frequency. In some cases, an impedance $R_{cn}$ at the combining node 155 is set to a value of approximately $R_{comb}/\beta$ where $R_{comb}$ is a value yet to be determined and β relates to the asymmetry factor α of the inverted Doherty amplifier according to the following expressions $$\beta = 1+\alpha \tag{EQ. 2}$$

$$\alpha = P_p/P_m \tag{EQ. 3}$$

where $P_p$ is a maximum output power capability of the peaking amplifier 138 and $P_m$ is a maximum output power capability of the main amplifier 132. The quantity p is sometimes referred to as the "modulation index" of a Doherty amplifier.

The value $R_{comb}$ is selected as an output impedance for the impedance-matching component 342. It is an impedance selected for a maximum power transfer by the inverted Doherty amplifier 300 when both the main amplifier 132 and peaking amplifier 138 are operating fully on. According to some embodiments, the main amplifier's impedance-matching component 342 transforms an impedance $R_{optm}$ presented to the main amplifier (selected for maximum power transfer from the main amplifier) to an impedance $R_{comb}$. With this choice, it can be shown that improved power transfer from both the main amplifier 132 and peaking amplifier to a load occurs when an impedance on the peaking amplifier circuit branch before the combining node 155 is $R_{comb}/\alpha$ and an impedance on the output line after the combining node is $R_{comb}/\beta$.

With the above choices of impedance values and modeling the impedance-matching components 342, 344, 360 and impedance inverter as transmission lines, their characteristic impedances may be selected as shown in FIG. 5. For example, a characteristic impedance of the impedance inverter 350 may be selected to be approximately $R_{comb}/\alpha$. The main amplifier's impedance-matching component 342 may transform an input impedance of approximately $R_{optm}$ to an output impedance of approximately $R_{comb}$ and have a characteristic impedance of approximately $(R_{optm} \times R_{comb})^{0.5}$. The output impedance-matching component 360 may transform an input impedance of approximately $R_{comb}/\beta$ to an output impedance of approximately $R_L$ and have a characteristic impedance of approximately $((R_{comb}/\beta \times R_L))^{0.5}$. The peaking amplifier's impedance-matching component 344 may transform an input impedance of approximately $R_{optp}$ (selected for maximum power transfer from the peaking amplifier according to EQ. 1) to an output impedance of approximately $R_{comb}/\alpha$ and have a characteristic impedance of approximately $(R_{optp} \times (R_{comb}/\alpha))^{0.5}$. If $Z_{optm}$, $Z_{optp}$ are only available for the main and peaking amplifiers, then $R_{optm}$ and $R_{optp}$ would be replaced by these values, respectively. $R_{comb}$ would then become $Z_{comb}$ in the expressions above and below. To simplify the following analysis, only real impedance values will be used.

The value for $R_{comb}$ can be determined in the following manner, according to some embodiments. As described above, the limiting RF fractional bandwidth (low-power bandwidth) for a Doherty amplifier occurs when the peaking amplifier 138 is off. Since there are impedance transformations between the output of the main amplifier 132 and the load $R_L$, a way to improve the low-power RF fractional bandwidth and amplifier's signal bandwidth is to approximately equalize the ratios of impedance transformations provided by the impedance-matching components 342, 360 between the main amplifier output and combining node and combining node and load according to the following expression.

$$R_{optm}/R_{comb} = (R_{comb}/\beta)/R_L \qquad (EQ. 4)$$

Solving EQ. 4 for $R_{comb}$ gives the following expression $$R_{comb} = \sqrt{R_{optm} \beta R_L} \qquad (EQ. 5)$$

where $R_{optm}$ represents an impedance-matched value for maximum power transfer from the main amplifier 132 (which may be determined approximately using EQ. 1 for the main amplifier), $R_L$ is the load impedance, and $\beta$ is the modulation index for the amplifier. Referring to FIG. 5 and using the relation of EQ. 2, the impedance at the combining node $R_{cn} = R_{comb}/\beta$ can be determined approximately from the following equation.

$$R_{cn} = \sqrt{\frac{R_{optm} R_L}{1+\alpha}} \qquad (EQ. 6)$$

EQ. 6 may be used to obtain a value for the impedance at the combining node 155 of an inverted Doherty amplifier. In some embodiments, an actual value may be within 30% of a value given by EQ. 6 ($R_{cn} \pm 0.5 R_{cn}$) to obtain improvements in Doherty amplifier performance. Similarly, $R_{comb}$ may be determined from EQ. 5 and the value may be used along with $\alpha$ and $\beta$ values to design impedance-matching components 342, 344, and 360 as well as the impedance inverter 350 (e.g., according to the expressions shown in FIG. 5).

For illustrative purposes only and without limiting the invention, some example impedance values may be calculated from the above equations for a GaN-based inverted Doherty amplifier. Different values may be obtained for inverted Doherty amplifiers based on other semiconductors or different transistor design. In some main amplifiers, a drain-to-source voltage may be approximately 50 V with a maximum current capability of 3 A, and a knee voltage may be approximately 3 V. From EQ. 1, $R_{optm}$ is approximately 31.3 ohms. If the inverted Doherty is symmetric and configured to drive a 50-ohm load, then from EQ. 6 the impedance $R_{cn}$ at the combining node 155 is approximately 28 ohms. $R_{comb}$ is then approximately 56 ohms. For the symmetric Doherty, the characteristic impedance of the impedance inverter 350 would be 56 ohms. In this example, each of the impedance-matching components 342, 344 would transform an impedance of 31.3 ohms from the amplifiers ($R_{optm} = R_{optp}$) to approximately 56 ohms. The output impedance-matching component 360 would transform an impedance of 28 ohms to a load impedance of 50 ohms. These values for impedances would be approximate values for the center of amplifier's RF fractional bandwidth. Although expressed as real (resistive) values only, in some cases there may be a small amount of capacitive or inductive (reactive) component to the impedances. Away from center frequency, the impedances may take on larger reactive values.

If the inverted Doherty amplifier were asymmetric ($\alpha > 1$), the values calculated would change based on values for $\alpha$ and $\beta$. The impedance at the combining node 155 would change. Then, the impedance-matching components 342, 344, and 360 may each match to different impedance values.

Simulations similar to those carried out for a conventional Doherty amplifier and discussed above in connection with FIG. 3, were carried out for an inverted Doherty amplifier configured as depicted in FIG. 5. In a first set of simulations, the impedance-matching components 342, 344 are modeled as quarter-wave transmission lines. The main amplifier's impedance-matching component 342 is modeled as a quarter-wave transmission line at 3.5 GHz having a characteristic impedance of $(R_{optm} R_{comb})^{0.5}$. The value of $R_{optm}$ for the simulation is 10 ohms, which may correspond to a 50-volt GaN transistor having a peripheral gate length of about 10 mm. The peaking amplifier's impedance-matching component 344 is modeled as a quarter-wave transmission line at 3.5 GHz having a characteristic impedance of $(R_{optp} R_{comb}/\alpha)^{0.5}$. The output impedance-matching component 360 is modeled as a quarter-wave transmission line at 3.5 GHz having a characteristic impedance of $(R_L R_{comb}/\beta)^{0.5}$. For the simulations, the load resistance is 50 ohms. The impedance inverter 350 is modeled as a quarter-wave transmission line at 3.5 GHz having a characteristic impedance of $R_{comb}/\alpha$. The asymmetry factor $\alpha$ is varied for the simulation from 1 to 1.5 to 2.

Figure 6:
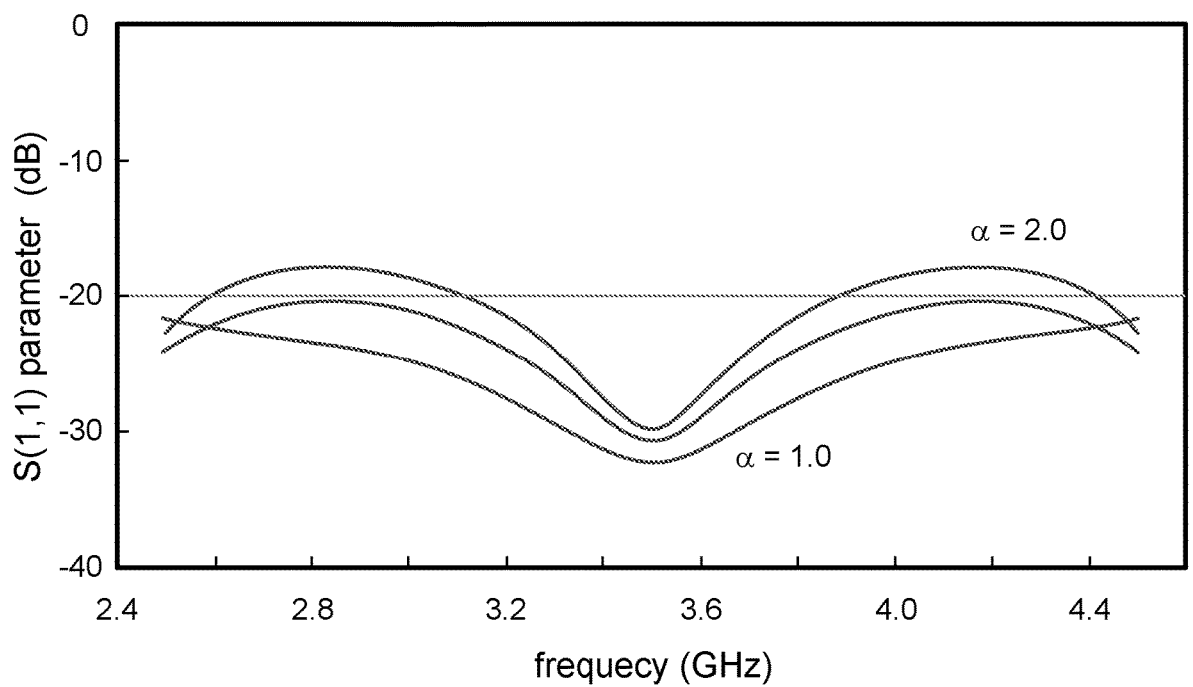
FIG. 6 plots frequency-response curves for symmetric and asymmetric inverted Doherty amplifiers, according to some embodiments.

Results from the simulation are shown in FIG. 6 for the low-power case (peaking amplifier idle). The graph plots the $S_{11}$ scattering parameter at the output of the main amplifier 132 as a function of frequency. Because the impedance-matching components and impedance inverter are all modeled as quarter-wave transmission lines having characteristic impedances indicated in FIG. 5, the resulting bandwidths are large.

For a symmetric inverted Doherty amplifier ($\alpha=1$), the RF fractional bandwidth is broad and reflected signals from the main amplifier's impedance-matching component do not rise about −20 dB over the simulated frequency range. In this case, the RF fractional bandwidth may be determined by the frequency characteristics of an impedance-matching network 800, 900 in the amplifier. For an asymmetric inverted Doherty amplifier ($\alpha=1.5$), the RF fractional bandwidth is still very broad and the reflected signals rise to about −20 dB at about 800 MHz away from the center frequency of 3.5 GHz. For an asymmetric inverted Doherty amplifier ($\alpha=2.0$), the RF fractional bandwidth is approximately 23%, a value significantly broader than conventional symmetric Doherty amplifiers. The signal bandwidth, which is typically smaller than the RF fractional bandwidth, will be correspondingly larger for an inverted Doherty amplifier designed according to the present embodiments. Although the RF fractional bandwidth and signal bandwidth reduce for higher asymmetry factors, the amplifier's efficiency improves. Accordingly, it may be beneficial to operate an asymmetric inverted Doherty amplifier at reduced bandwidth values to gain improved efficiency.

Signal bandwidth (also referred to as "instantaneous bandwidth" or "video bandwidth") may be defined as a largest modulating signal that can be amplified by an inverted Doherty amplifier without asymmetrical distortion. The signal bandwidth is less than or equal to the RF fractional bandwidth. Avoiding introduction of asymmetrical distortion can be important, since digital predistortion systems (which may be used in combination with Doherty amplifiers to linearize signals) may not be able to correct for asymmetrical distortion.

One approach to measuring signal bandwidth is to apply two unmodulated carrier tones to an inverted Doherty amplifier. The spacing (in frequency) between the two carrier tones may be small initially (e.g., several kilohertz or megahertz) and then increased while amplitudes of third-order intermodulation products are plotted as a function of the frequency spacing. A frequency spacing at which there is a significant change in the divergence of the third-order intermodulation products approximately represents the signal bandwidth, according to some embodiments.

Figure 7:
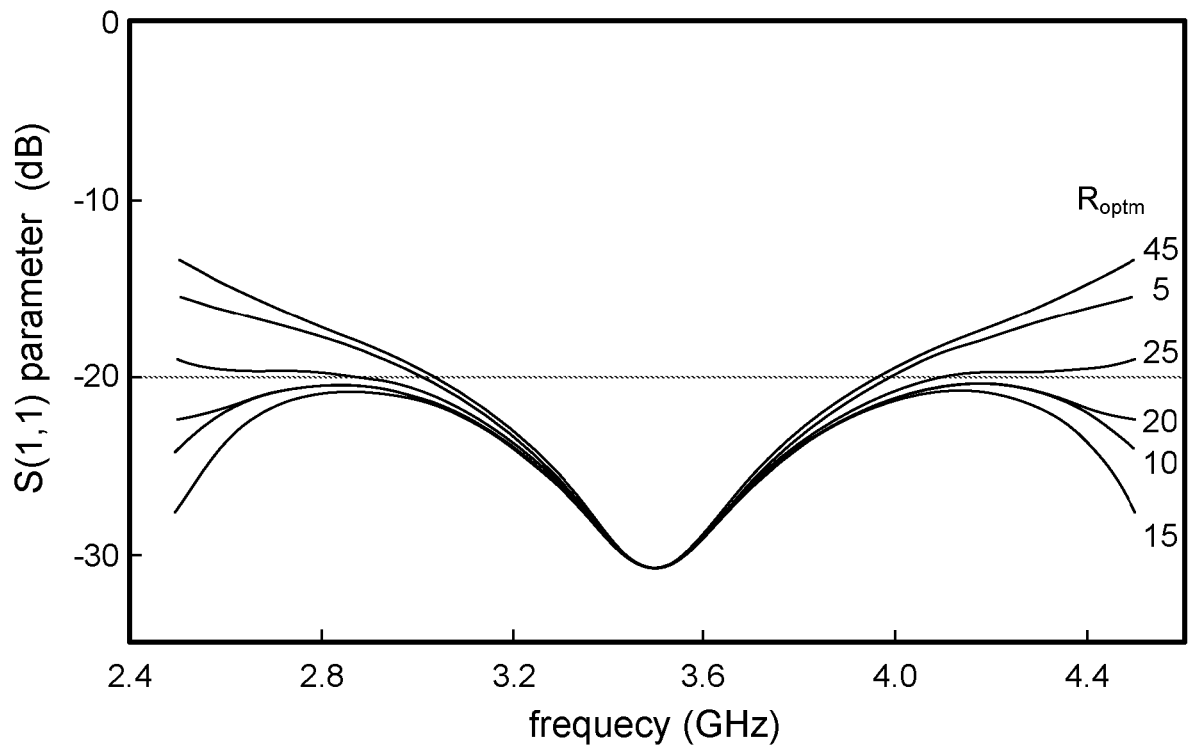
FIG. 7 plots frequency-response curves for an asymmetric inverted Doherty amplifier in which an impedance at the combining node is varied, according to some embodiments.

Additional simulations were carried out for a same inverted Doherty configuration depicted in FIG. 5 to assess the sensitivity of the RF fractional bandwidth to changes in $R_{optm}$. Results of these simulations are shown in FIG. 7. In these simulations, the asymmetry factor $\alpha$ is fixed at 1.5 and $R_{optm}$ is varied from 5 ohms to 45 ohms in steps of 5 ohms. The values of $R_{optm}$ ranging from 5 ohms to 25 ohms are shown in the graph beside each curve. A curve is also plotted for $R_{optm}=45$ ohms. For values of $R_{optm}$ between approximately 10 ohms and 20 ohms, the reflected signal does not rise above −20 dB, indicating potentially broad RF and signal bandwidths. For values of $R_{optm}$ less than approximately 10 ohms, the RF fractional bandwidth becomes well defined and narrows with decreasing values of $R_{optm}$. For values of $R_{optm}$ greater than approximately 20 ohms, the RF fractional bandwidth becomes well defined and narrows with increasing values of $R_{optm}$. Even at $R_{optm}$ values of 5 ohms and 45 ohms, the RF fractional bandwidth is approximately 29% for an asymmetric configuration, which is much larger than the typical 4% bandwidth value of a conventional symmetric Doherty amplifier. The signal bandwidth, which can be no larger than the RF fractional bandwidth and is typically less, will also be significantly larger than the signal bandwidth for a conventional Doherty amplifier. The RF and signal bandwidths will be even larger for a symmetrical inverted Doherty amplifier configured according to the present embodiments.

The results of FIG. 7 indicate that $R_{optm}$ can vary by as much as ±50% (e.g., 20 ohms±10 ohms) in the inverted Doherty amplifier of the present embodiments, and provide significantly improved RF and signal bandwidths compared to conventional Doherty amplifiers. For larger bandwidths, $R_{optm}$ may vary by a smaller amount (e.g., 33%, 15 ohms±5 ohms). In some cases, $R_{optm}$ may vary by no more than 20% to obtain larger bandwidths.

Since the impedance $R_{cn}$ at the combining node 155 may be determined approximately based on $R_{optm}$ according to EQ. 6, variations in Ren may accordingly be smaller than variations in $R_{optm}$. For example, when $R_{optm}$ is 20 ohms±10 ohms, $R_{cn}$ may vary by not more than approximately ±30% to obtain improved RF and signal bandwidths. When $R_{optm}$ is 15 ohms±5 ohms, $R_{cn}$ may vary by not more than approximately ±20% to obtain improved RF and signal bandwidths. In some cases, $R_{cn}$ may vary by not more than approximately ±10% to obtain improved RF and signal bandwidths. According to some embodiments, $R_{cn}$ may vary by not more than approximately ±50% and an inverted Doherty amplifier of the present embodiments may provide larger RF fractional and signal bandwidths compared to a conventional Doherty amplifier.

Figure 8:
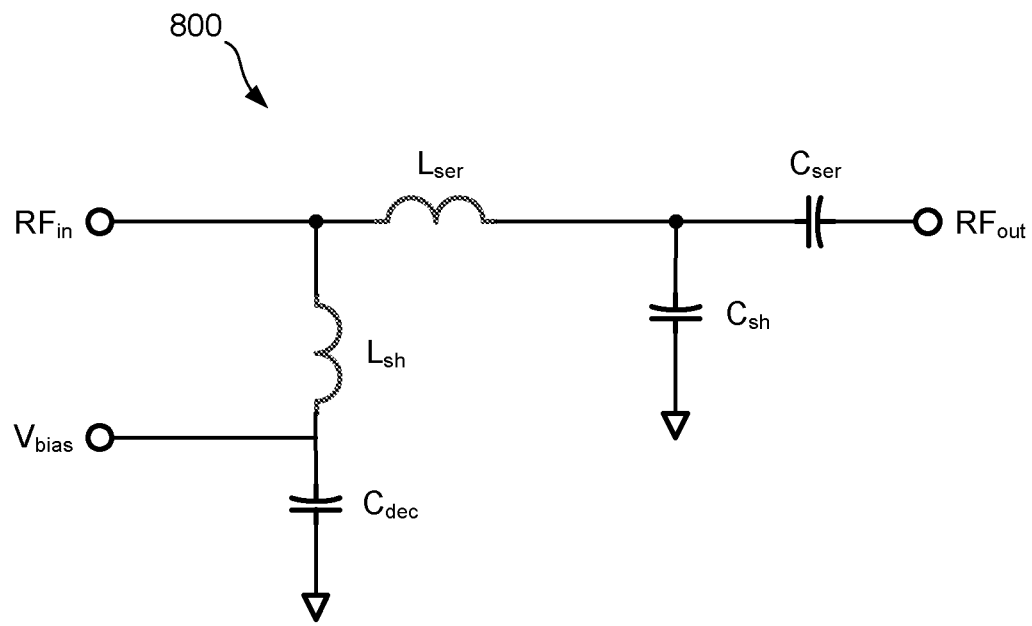
FIG. 8 illustrates an impedance-matching network, according to some embodiments.

The inventors have further recognized and appreciated that careful design of the impedance-matching components 342, 344 can improve broad bandwidth performance and allow biasing of the main and peaking amplifiers. An example impedance-matching network 800 is shown in FIG. 8, according to some embodiments. The depicted impedance-matching network may be used for either or both of the impedance-matching components 342, 344. In some embodiments, an impedance-matching network 800 comprises a shunt inductor $L_{sh}$ connected in series with a decoupling capacitor $C_{dec}$ between an input RF port or node on an input RF signal path and a reference potential (ground shown in the drawing). In some embodiments, the shunt inductor $L_{sh}$ may comprise one or more wire bonds that connect to one or more drain pads of the amplifier's transistor(s) (not shown). The impedance-matching network 800 may further include a series inductor $L_{ser}$ and series capacitor $C_{ser}$ that connect in series and carry an RF signal from an input port to an output port of the impedance-matching network 800. The series inductor $L_{ser}$ may comprise one or more wire bonds that connect to one or more drain pads of the amplifier's transistor(s) (not shown). The impedance-matching network 800 may further include a shunt capacitor $C_{sh}$ that connects between a reference potential (ground shown) and a node (e.g., an electrode of the series capacitor $C_{ser}$) on the RF signal path between the series inductor $L_{ser}$ and series capacitor $C_{ser}$. The capacitors $C_{sh}$, $C_{ser}$, and $C_{dec}$ may comprise bar capacitors in some implementations.

According to some embodiments, an impedance-matching network 800 may further include a biasing port $V_{bias}$ that is used to apply a drain-to-source bias to the amplifier's transistor(s). The biasing port may connect to a node between the shunt inductor $L_{sh}$ and decoupling capacitor $C_{dec}$.

Figure 9:
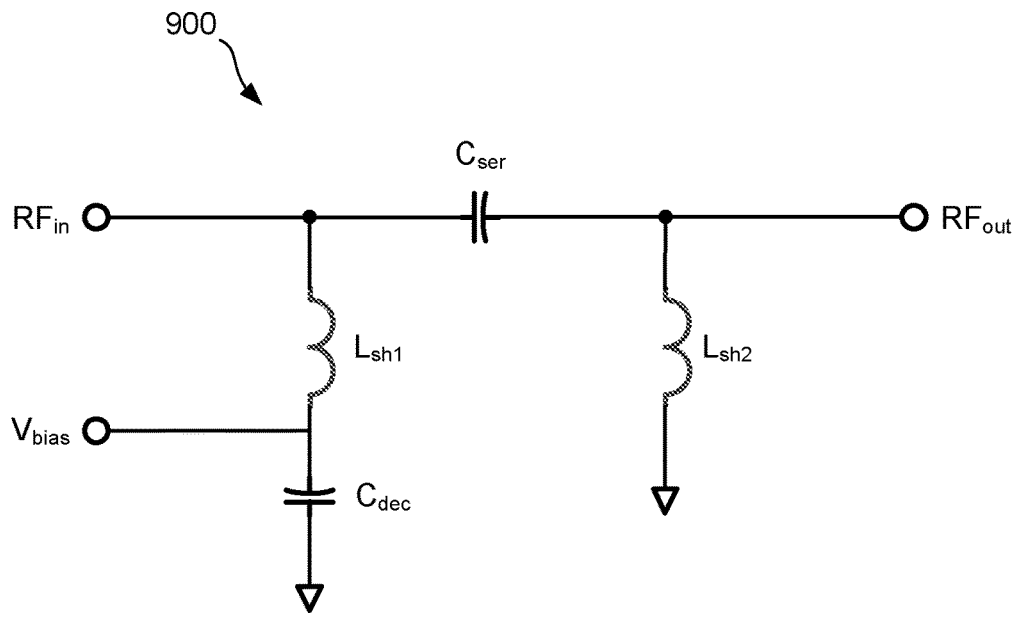
FIG. 9 illustrates an impedance-matching network for an inverted Doherty amplifier, according to some embodiments.

Another example of an impedance-matching network 900 is illustrated in FIG. 9. The impedance-matching network 900 of FIG. 9 may be used for either or both of the impedance-matching components 342, 344. In some embodiments, an impedance-matching network 900 comprises a shunt inductor $L_{sh1}$ connected in series with a decoupling capacitor $C_{dec}$ between an input RF port or node on an input RF signal path and a reference potential (ground shown in the drawing). The shunt inductor $L_{sh1}$ may comprise one or more wire bonds that connect to one or more drain pads of the amplifier's transistor(s) (not shown). The impedance-matching network 900 may further include a series capacitor $C_{ser}$ that connects between the input RF port and an output RF port. The impedance-matching network 900 may further include a second shunt inductor $L_{sh2}$ that connects between a reference potential (ground shown) and a node on the RF signal path after the series capacitor $C_{ser}$. The series capacitor $C_{ser}$ may connect between ends of the two shunt inductors $L_{sh1}$, $L_{sh2}$. The impedance-matching network 900 may further include a biasing port $V_{bias}$ that is used to apply a drain-to-source bias to the amplifier's transistor(s). The biasing port may connect to a node between the shunt inductor $L_{sh1}$ and the decoupling capacitor $C_{dec}$.

Values for the inductors and capacitors of an impedance-matching network 800, 900 may be selected to obtain a desired phase delay and impedance-transformation by the impedance-matching network. Following the example above for a symmetric Doherty described in connection with FIG. 5 where $R_{optm}$ is 31.3 ohms and $R_{comb}$ is 56 ohms, the values of inductors and capacitors for the main amplifier's impedance-matching component 342 would be chosen to provide an impedance transformation from approximately 31.3 ohms to approximately 56 ohms and provide a phase delay of approximately 90 degrees at center frequency of the RF fractional bandwidth.

Both impedance-matching networks shown in FIG. 8 and FIG. 9 can provide the desired impedance transformations and phase delay, though there is a bandwidth associated with each impedance-matching network. Using RF circuit simulations for the two impedance-matching networks, the inventors have found that the arrangement of elements in an impedance-matching network 800 of FIG. 8 can provide a 90° phase delay at a center frequency of approximately 2.65 GHz and exhibit an RF fractional bandwidth of approximately 19% (determined from a frequency analysis of the $S_{11}$ scattering parameter where reflected signals rise to 20 dB below the incident signal). The phase delay varies by about ±15° over the RF fractional bandwidth. For this simulation $L_{sh}$=1.25 nH; $C_{dec}$=0.1 µF; $L_{ser}$=1.29 nH; $C_{ser}$=33.17 pF; and $C_{sh}$=2.73 pF. Other values may be used to obtain a similarly broad bandwidth at other center frequencies.

For comparison, the impedance-matching network 900 of FIG. 9 can provide a 90° phase delay at approximately 2.59 GHz and exhibit an RF fractional bandwidth of about 7%. Its phase delay also varies from about 105° at 2.38 GHz to about 75° at 2.8 GHz. For this simulation, $L_{sh1}$=0.42 nH; $C_{dec}$=0.1 µF; $C_{ser}$=2.96 pF; and $L_{sh2}$=1.31 nH. In view of the analyses, the structure shown in FIG. 8 should provide a larger RF fractional bandwidth and signal bandwidth when incorporated in an inverted Doherty amplifier of the present embodiments.

According to some embodiments, the impedance-matching components 342, 344, 360 and impedance inverter 350 have predetermined phase delays. The impedance-matching components 342, 344, 360 may each have approximately quarter-wave (90°) phase delays at center frequency. In some cases, the impedance inverter 350 may provide a 90° phase delay at center frequency. However, the inventors have recognized and appreciated that increasing the phase delay of the impedance inverter 350 by odd multiples of 90° can improve the RF bandwidth of the inverted Doherty amplifier. This result is somewhat surprising, because it is an opposite trend than that observed when increasing the phase delay of the impedance inverter in a conventional Doherty amplifier.

To include the effects of an impedance-matching network 800 depicted in FIG. 8 and to assess the effect of increased phase delay in the impedance inverter 350, additional simulations were carried out. In these simulations, a symmetric, high-power (150 W) inverted Doherty amplifier configuration of FIG. 5 is modeled. For the simulations, a same quarter-wave network 800 depicted in FIG. 8 is used for each impedance-matching component 342, 344. The load $R_L$ is 50 ohms, and the output impedance-matching network 360 is modeled as a quarter-wave transmission line at 2.6 GHz having a characteristic impedance of $(50R_{comb}/2)^{0.5}$. In a first simulation, the impedance inverter 350 is modeled as a transmission line having a characteristic impedance of $R_{comb}$ and a phase delay of 90°. In a second simulation, the impedance inverter 350 is modeled as a transmission line having a characteristic impedance of $R_{comb}$ and a phase delay of 270°. The value of $R_{optm}$ is approximately 10 ohms. Because $R_{optm}$ has a small value, there is a larger impedance mismatch between the output of the main amplifier and the load compared to a case where $R_{optm}$ is 25 ohms, for example. Because of the larger mismatch and bandwidth limiting imposed by the main amplifier's impedance-matching network 800, the overall bandwidth is narrower than the cases shown in FIG. 7.

Figure 10:
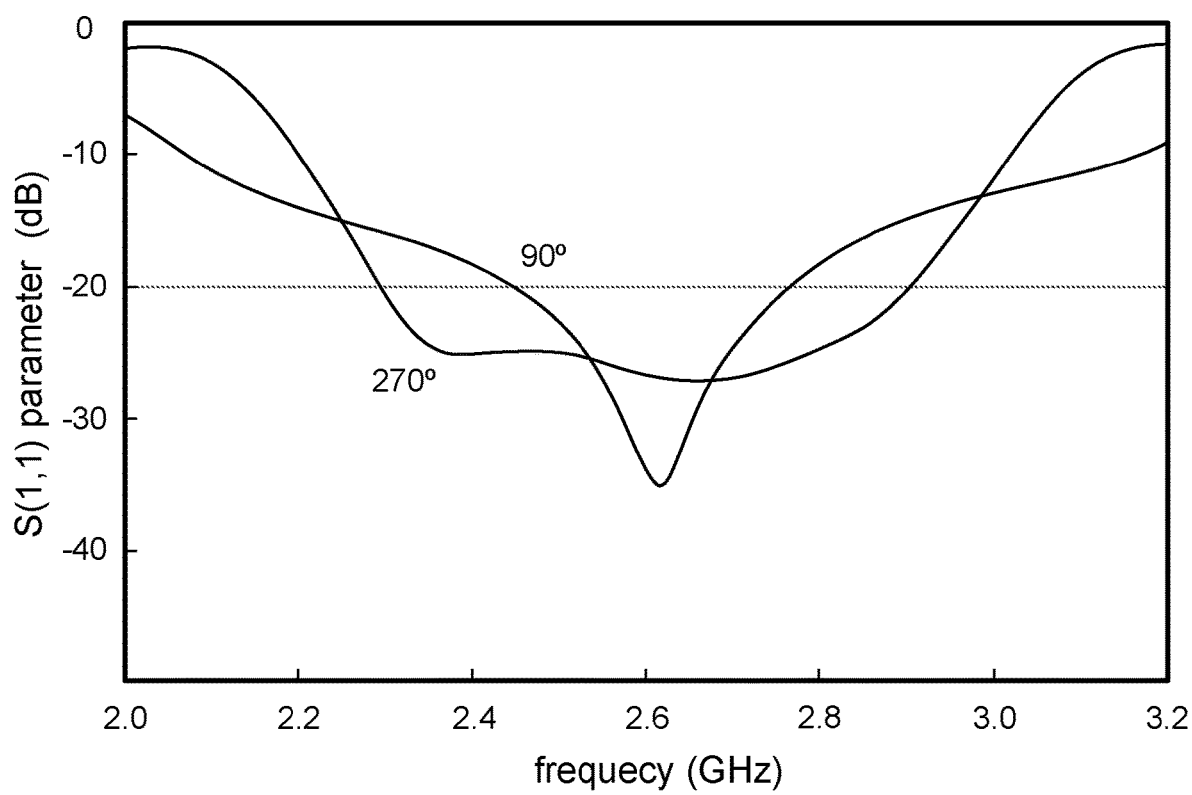
FIG. 10 plots frequency-response curves for two embodiments of inverted Doherty amplifiers, according to some embodiments.

Results from the high-power, symmetric inverted Doherty simulations are plotted in FIG. 10 for two cases. Both cases are low-power cases where the peaking amplifier is idle, which represent the most restrictive cases in terms of amplifier bandwidth. In both simulations, component values for the impedance-matching network 800 are: $L_{sh}$=1.06 nH; $C_{dec}$=0.1 µF; $L_{ser}$=1.20 nH; $C_{ser}$=99.02 pF; and $C_{sh}$=2.32 pF.

In a first simulation (marked as 90°), the phase delay provided by the impedance inverter 350 is 90 degrees. The effect of the impedance-matching network 800 reduces the RF fractional bandwidth of the inverted Doherty amplifier. The RF fractional bandwidth (determined from the $S_{11}$ scattering parameter at the output of the main amplifier) is approximately 12% when the impedance inverter 350 provides a delay of 90°. Even for this high-power case where $R_{optm}$ is small, the RF fractional bandwidth is about three times larger than that for a conventional Doherty amplifier.

Reconfiguring the impedance inverter 350 to provide a phase delay of 270° increases, somewhat surprisingly, the RF fractional bandwidth to approximately 24%. The result is plotted in FIG. 10 as a second curve marked as 270°. It is believe that the added phase delay at the impedance inverter 350 provides compensating circuitry for the main amplifier's impedance-matching network 800.

The results above indicate that improvements in amplifier RF and signal bandwidths can be obtained with an inverted Doherty amplifier configuration in which the designs of the impedance-matching components, the impedance inverter, and the impedance at the combining node are based upon characteristics of the main and peaking amplifiers ($R_{optm}$, $R_{optp}$), asymmetry factor of the Doherty, and load impedance. In part, bandwidth improvements can be realized by approximately equalizing impedance-transformation ratios from an output of the main amplifier 132 to the combining node 155 and from the combining node to the load. In part, bandwidth improvements can be realized by setting an impedance at the combining node to a value that is proportional to the square root of $R_{optm}$, as indicated in EQ. 6. In part, bandwidth improvements can be realized by implementing impedance-matching networks at outputs of the main amplifier 132 and peaking amplifier 138 that include a shunt inductor $L_{sh}$ connected in series with a decoupling capacitor $C_{dec}$. In part, bandwidth improvements can be realized by using a transmission-line impedance inverter 350 between the peaking amplifier 138 and combining node 155 that has a characteristic impedance value ($R_{comb}/\alpha$) that is proportional to the square root of $R_{optm}$ as can be determined approximately from EQ. 5. In part, bandwidth improvements can be realized by increasing the phase delay of the impedance inverter 350 to an odd multiple of 90°.

Although the peaking amplifier's impedance-matching component 344 and the impedance inverter 350 are depicted as separate components, in some implementations their functionality may be combined into one network that transforms an impedance of $R_{optp}$ to an impedance of $R_{comb}/\alpha$ and provides a phase delay of (n+1)180°, where n is 0 or a positive integer value.

In some embodiments, an asymmetric inverted Doherty amplifier may be constructed in different ways. One method would be to size the gate width of a power transistor in the peaking amplifier 132 larger than a gate width of a power transistor in the main amplifier 138. Another method is to use different drain-to-source voltage biases on the power transistors 132 of the main amplifier and peaking amplifier 138. Another method is to tune the impedance-matching networks 342, 344 to imbalance power from each amplifier. Simulations show that the bandwidth performance of inverted Doherty amplifiers configured according to the present embodiments is very stable and nearly independent of the method used to construct the inverted Doherty amplifier. Of the different approaches, constructing an asymmetric inverted Doherty amplifier by sizing gate widths differently or tuning impedance-matching components provides larger bandwidths.

Figure 11:
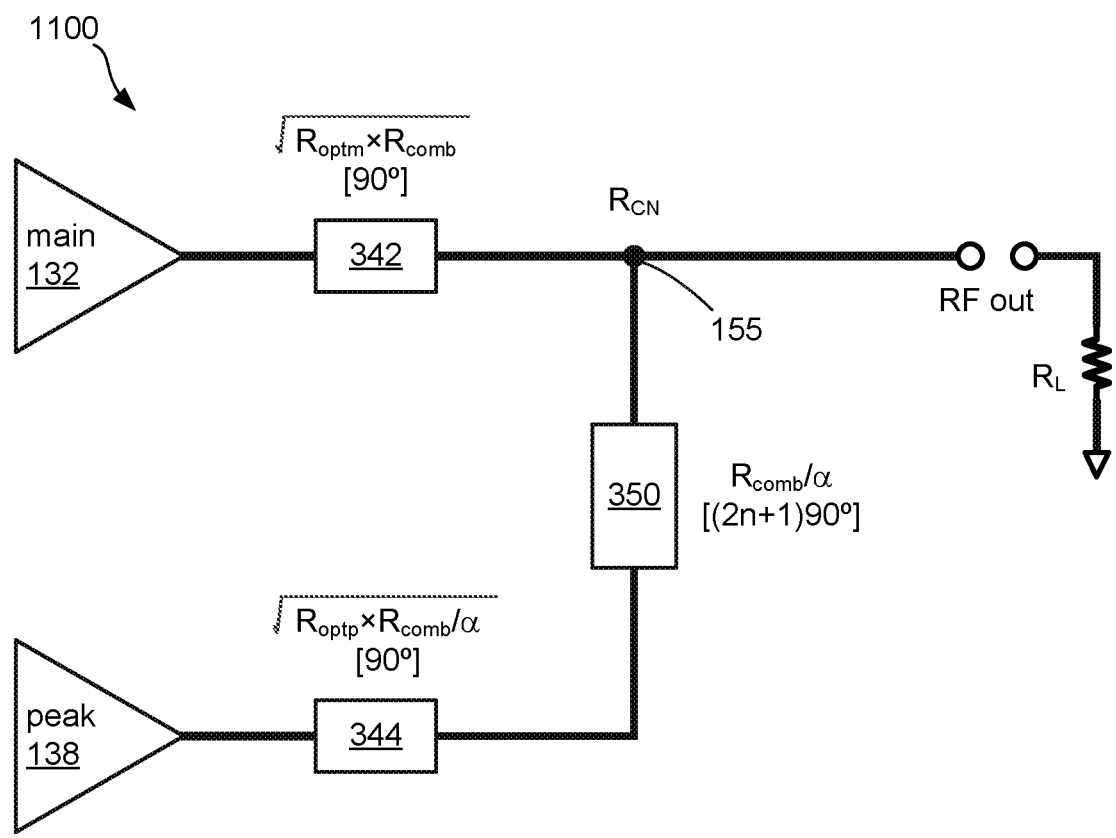
FIG. 11 depicts components of an inverted Doherty amplifier, according to some embodiments.

According to some embodiments, a more compact amplifier package may be obtained by omitting the output impedance-matching component 360 in an inverted Doherty amplifier 1100, as depicted in FIG. 11. In this case, the value for $R_{comb}$ may still be determined from EQ. 5. The values for the impedance-matching components 342, 344 and impedance inverter 350 may be determined as described above based on $R_{comb}$, $R_{optm}$, $R_{optp}$, $\alpha$, and $\beta$. Although an inverted Doherty amplifier constructed according to this embodiment may operate at a reduced bandwidth compared to the results shown in FIG. 10, it can provide a more compact amplifier package by omitting the output impedance-matching network 360. The amplifier would have less power loss by omitting the output impedance-matching network, and therefore may have better efficiency than an amplifier constructed with components shown in FIG. 4. Such an inverted Doherty amplifier can still have larger RF and signal bandwidths compared to conventional Doherty amplifiers.

Embodiments also relate to methods of operating inverted Doherty amplifiers. As an example, a method of operating an inverted Doherty amplifier 300 may comprise acts of providing an RF signal to a coupler 110 arranged to divide the RF signal into a first signal provided to a first circuit branch and a second signal provided to a second circuit branch and to add a first phase delay to the first signal with respect to the second signal by an amount between 80° and 100°. A method may further include amplifying the signal with a main amplifier 132 in the first circuit branch and selectively amplifying the signal with a peaking amplifier 138 in the second circuit branch. The peaking amplifier 138 may be operated as a class C amplifier and configured or biased to provide amplification when the input signal exceeds a predetermined power level and not provide amplification when the input signal is less than the predetermined power level.

A method of operating an inverted Doherty amplifier 300 may further include providing an amplified signal from the main amplifier 132 to a first impedance-matching component 342 connected between an output of the main amplifier 132 and a combining node 155 that combines signals from the first circuit branch and the second circuit branch. A method may also include providing a signal from the peaking amplifier 138 to a second impedance-matching component 344 connected between an output of the peaking amplifier and the combining node, to an impedance inverter 350 connected between the second impedance-matching component 344 and the combining node 155, and to the combining node 155. The signals may be combined at the combining node 155 where an impedance at the combining node is set approximately according to EQ. 6 (e.g., within 30% of the value determined by EQ. 6). In some embodiments, the impedance-matching components 342, 344 are lumped-element networks, for which impedance transformations are according to the expressions shown in FIG. 5 (e.g., from $R_{optm}$ to $R_{comb}$ and from $R_{optp}$ to $R_{comb}/\alpha$). In some implementations, the impedance inverter 350 is an integrated transmission line having a characteristic impedance of approximately $R_{comb}/\alpha$, and a method comprises providing a phase delay, by the impedance inverter, that is an odd multiple of 90°.

A method of operating an inverted Doherty amplifier 300 may further include providing the signal from the combining node 155 to a third impedance-matching component 360 and an output port of the amplifier. The third impedance-matching component 360 may provide an impedance transformation according to the expression shown in FIG. 5 (e.g., from $R_{comb}/\beta$ to $R_L$). In some implementations, a method comprises equalizing impedance transformation ratios for a signal traveling from the main amplifier to the load before and after the combining node.

A method of operating an inverted Doherty amplifier 300 may further include biasing one or both of the main amplifier 132 and peaking amplifier 138 via a shunt inductor $L_{sh}$ in each impedance-matching component 342, 344. The shunt inductor in each impedance-matching component 342, 344 may be connected in series with a decoupling capacitor $C_{dec}$ between an RF signal path and a reference potential (e.g., ground).

In some implementations, a method of operating an inverted Doherty amplifier 1100 may comprise providing a signal from the combining node directly to an output port and load with no intervening impedance inverter.

CONCLUSION

Unless stated otherwise, the terms "approximately" and "about" may be used to mean within ±20% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be implemented in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. An inverted Doherty amplifier comprising:
a main amplifier in a first circuit branch;
a peaking amplifier in a second circuit branch;
a combining node located where a first portion of the first circuit branch after the main amplifier connects with a second portion of the second circuit branch after the peaking amplifier;
a first impedance-matching component connected in the first portion of the first circuit branch between the main amplifier and the combining node, the first impedance-matching component comprising an output impedance of $R_{comb}$; and
an impedance inverter connected in the second portion of the second circuit branch between the peaking amplifier and the combining node, the impedance inverter comprising an impedance value of $R_{comb}/\alpha$, wherein:
$\alpha$ is an asymmetry factor for the inverted Doherty amplifier,
the asymmetry factor is a ratio of a maximum power output by the peaking amplifier to a maximum power output by the main amplifier, and
the impedance inverter adds a phase delay of approximately 270 degrees.

2. The inverted Doherty amplifier of claim 1, further comprising an output port connected to the combining node and configured to connect to an external circuit with no impedance-matching component located between the output port and the combining node.

3. The inverted Doherty amplifier of claim 1, wherein an impedance on the second circuit branch before the combining node is $R_{comb}/\alpha$, an impedance after the combining node is $R_{comb}/\beta$, and $\beta$ is 1+$\alpha$.

4. The inverted Doherty amplifier of claim 1, wherein the first impedance-matching component transforms an input impedance to the output impedance of $R_{comb}$ that is within 30% of a value determined by the following expression:

$$\sqrt{Z_{optm}R_L(1+\alpha)}$$

where $Z_{optm}$ is an impedance load for the main amplifier that, when connected at an output of the main amplifier, would provide maximum power transfer from the main amplifier, and $R_L$, is a resistance of a load to be driven by the inverted Doherty amplifier.

5. The inverted Doherty amplifier of claim 1, wherein an RF fractional bandwidth of the inverted Doherty amplifier, defined by an S11 scattering parameter at the output of the main amplifier looking toward the combining node with the peaking amplifier in a non-amplifying state is between 7% and 25% when an asymmetry factor for the inverted Doherty amplifier is 1.

6. The inverted Doherty amplifier of claim 1, wherein the combining node is arranged to connect directly to a load having an impedance approximately equal to 50 ohms.

7. The inverted Doherty amplifier of claim 1, further comprising a coupler arranged to divide an input signal into a first signal provided to the first circuit branch and a second signal provided to the second circuit branch and to add a first phase delay to the first signal with respect to the second signal by more than 80 degrees.

8. An inverted Doherty amplifier, comprising:
a main amplifier in a first circuit branch;
a peaking amplifier in a second circuit branch;
a combining node located where a first portion of the first circuit branch after the main amplifier connects with a second portion of the second circuit branch after the peaking amplifier;
a first impedance-matching component connected in the first portion of the first circuit branch between the main amplifier and the combining node, the first impedance-matching component comprising an output impedance of $R_{comb}$; and
an impedance inverter connected in the second portion of the second circuit branch between the peaking amplifier and the combining node, the impedance inverter comprising an impedance value of $R_{comb}/\alpha$, wherein:
$\alpha$ is an asymmetry factor for the inverted Doherty amplifier,
the asymmetry factor is a ratio of a maximum power output by the peaking amplifier to a maximum power output by the main amplifier, and
the first impedance-matching component comprises a shunt inductor, a decoupling capacitor, and a biasing port connected to a node between the shunt inductor and the decoupling capacitor.

9. The inverted Doherty amplifier of claim 8, wherein an RF fractional bandwidth of the inverted Doherty amplifier, defined by an S11 scattering parameter at the output of the main amplifier looking toward the combining node with the peaking amplifier in a non-amplifying state is between 7% and 25% when an asymmetry factor for the inverted Doherty amplifier is 1.

10. The inverted Doherty amplifier of claim 1, wherein an impedance value of the first impedance-matching component is within 30% of a value determined by the following expression:

$$\sqrt{Z_{optm}R_{comb}}$$

where $Z_{optm}$ is an impedance load for the main amplifier that, when connected at an output of the main amplifier, would provide maximum power transfer from the main amplifier.

11. The inverted Doherty amplifier of claim 1, wherein the first impedance-matching component provides approximately 90 degrees of phase delay.

12. The inverted Doherty amplifier of claim 1, further comprising a second impedance-matching component connected in the second portion of the second circuit branch between the peaking amplifier and the impedance inverter.

13. The inverted Doherty amplifier of claim 12, wherein an impedance value of the second impedance-matching component is within 30% of a value determined by the following expression:

$$\sqrt{Z_{optp}R_{comb}/\alpha}$$

where $Z_{optp}$ is an impedance load for the peaking amplifier that, when connected at an output of the peaking amplifier, would provide maximum power transfer from the peaking amplifier.

14. The inverted Doherty amplifier of claim 12, wherein the second impedance-matching component comprises a shunt inductor, a decoupling capacitor, and a biasing port connected to a node between the shunt inductor and the decoupling capacitor.

15. The inverted Doherty amplifier of claim 12, wherein the second impedance-matching component provides approximately 90 degrees of phase delay.

16. A method of operating an inverted Doherty amplifier, the method comprising:
   receiving an input signal;
   dividing the input signal;
   providing a first portion of the input signal to a first circuit branch containing a main amplifier;
   providing a second portion of the input signal to a second circuit branch containing a peaking amplifier;
   transforming, with a first impedance-matching component connected in the first portion of the first circuit branch between the main amplifier and a combining node, a first input impedance to an output impedance of $R_{comb}$; and
   transforming, with an impedance inverter connected in the second portion of the second circuit branch between the peaking amplifier and the combining node, a second input impedance to an output impedance of $R_{comb}/\alpha$, where wherein:

α is an asymmetry factor for the inverted Doherty amplifier,
the asymmetry factor is a ratio of a maximum power output by the peaking amplifier to a maximum power output by the main amplifier, and
the impedance inverter adds a phase delay of approximately 270 degrees.

17. The method of claim 16, the first impedance-matching component transforms the first input impedance to the output impedance of $R_{comb}$ that is within 30% of a value determined by the following expression $$\sqrt{Z_{optm}R_L(1+\alpha)}$$

where $Z_{optm}$ is an impedance load for the main amplifier that, when connected at an output of the main amplifier, would provide maximum power transfer from the main amplifier, and $R_L$, is a resistance of a load to be driven by the inverted Doherty amplifier.

18. The inverted Doherty amplifier of claim 8, wherein the impedance inverter adds a phase delay of approximately 270 degrees.

19. The method of claim 16, wherein an RF fractional bandwidth of the inverted Doherty amplifier, defined by an S11 scattering parameter at the output of the main amplifier looking toward the combining node with the peaking amplifier in a non-amplifying state is between 7% and 25% when an asymmetry factor for the inverted Doherty amplifier is 1.

20. The method of claim 16, wherein the combining node is arranged to connect directly to a load having an impedance approximately equal to 50 ohms.

* * * * *